(12) United States Patent
O'Banion et al.

(10) Patent No.: US 11,901,165 B2
(45) Date of Patent: Feb. 13, 2024

(54) PROCESSING CHAMBER WITH OPTICAL FIBER WITH BRAGG GRATING SENSORS

(71) Applicant: iSenseCloud, Inc., San Jose, CA (US)

(72) Inventors: William J. O'Banion, San Jose, CA (US); An-Dien Nguyen, Fremont, CA (US); Huy D. Nguyen, San Jose, CA (US)

( * ) Notice: Subject to any disclaimer, the term of this patent is extended or adjusted under 35 U.S.C. 154(b) by 450 days.

(21) Appl. No.: 16/952,884

(22) Filed: Nov. 19, 2020

(65) Prior Publication Data

US 2021/0090865 A1  Mar. 25, 2021

Related U.S. Application Data

(60) Division of application No. 16/036,359, filed on Jul. 16, 2018, now Pat. No. 10,861,682, which is a
(Continued)

(51) Int. Cl.
| | |
|---|---|
| H01J 37/32 | (2006.01) |
| G02B 6/02 | (2006.01) |
| G02B 6/42 | (2006.01) |
| G01K 11/3206 | (2021.01) |
| G01N 29/24 | (2006.01) |
| G01N 29/14 | (2006.01) |
| G01K 1/14 | (2021.01) |
| G01J 3/02 | (2006.01) |
| H01L 21/687 | (2006.01) |

(Continued)

(52) U.S. Cl.
CPC ....... *H01J 37/32917* (2013.01); *G01J 3/0208* (2013.01); *G01K 1/14* (2013.01); *G01K 11/3206* (2013.01); *G01N 29/14* (2013.01); *G01N 29/2418* (2013.01); *G01N 29/2462* (2013.01); *G02B 6/0208* (2013.01); *G02B 6/4204* (2013.01); *G01J 3/18* (2013.01); *H01J 2237/24585* (2013.01); *H01L 21/68742* (2013.01); *H01S 5/0617* (2013.01); *H01S 5/06804* (2013.01); *H01S 5/06808* (2013.01); *H01S 5/4087* (2013.01)

(58) Field of Classification Search
CPC ...... G01K 11/3206; G01K 1/14; G01N 29/14; G01N 29/2418; G01N 29/2462; G02B 6/02076; G02B 6/0208; G02B 6/32; G02B 6/4204; H01J 2237/24585; H01J 37/32917; H01L 21/67109; H01L 21/6831; H01L 21/6833; H01L 21/68742; H01S 5/0617; H01S 5/06804; H01S 5/06808; H01S 5/4087
USPC ......................................................... 356/237
See application file for complete search history.

(56) References Cited

U.S. PATENT DOCUMENTS

| | | | | |
|---|---|---|---|---|
| 5,948,300 A | * | 9/1999 | Gero .................... | C30B 25/14 219/390 |
| 2013/0228323 A1 | * | 9/2013 | Makabe ................ | F28F 27/02 165/59 |

(Continued)

*Primary Examiner* — Sunghee Y Gray
(74) *Attorney, Agent, or Firm* — W. Eric Webostad

(57) ABSTRACT

An apparatuses relating generally to a test wafer, processing chambers, and method relating generally to monitoring or calibrating a processing chamber, are described. In one such an apparatus for a test wafer, there is a platform. An optical fiber with Fiber Bragg Grating sensors is located over the platform. A layer of material is located over the platform and over the optical fiber.

5 Claims, 15 Drawing Sheets

Related U.S. Application Data continuation-in-part of application No. 15/458,311, filed on Mar. 14, 2017, now Pat. No. 10,209,060, said application No. 16/036,359 is a continuation-in-part of application No. 14/814,355, filed on Jul. 30, 2015, now Pat. No. 10,033,153.

(60) Provisional application No. 62/595,515, filed on Dec. 6, 2017, provisional application No. 62/310,664, filed on Mar. 18, 2016, provisional application No. 62/062,429, filed on Oct. 10, 2014, provisional application No. 62/031,790, filed on Jul. 31, 2014.

(51) Int. Cl.
*H01S 5/06* (2006.01)
*H01S 5/068* (2006.01)
*H01S 5/40* (2006.01)
*G01J 3/18* (2006.01)

(56) References Cited

U.S. PATENT DOCUMENTS

| | | | |
|---|---|---|---|
| 2015/0170977 A1* | 6/2015 | Singh | H01L 21/67109 |
| | | | 118/712 |
| 2016/0007411 A1* | 1/2016 | Busche | H05B 3/0047 |
| | | | 392/408 |

* cited by examiner

PROCESSING CHAMBER WITH OPTICAL FIBER WITH BRAGG GRATING SENSORS

CROSS-REFERENCE TO RELATED APPLICATION(S)

This nonprovisional application is a divisional application of, and hereby claims priority to, pending U.S. patent application Ser. No. 16/036,359, filed Jul. 16, 2018 (now U.S. Pat. No. 10,861,682), which claims benefit under 35 U.S.C § 119(e) of priority to provisional application 62/595,515, filed Dec. 6, 2017, and which is a continuation-in-part of U.S. patent application Ser. No. 15/458,311, filed Mar. 14, 2017 (now U.S. Pat. No. 10,209,060), which claims the benefit of priority under 35 U.S.C. section 119(e) to U.S. Provisional Patent Application Ser. No. 62/310,664, filed Mar. 18, 2016, and further is a continuation-in-part of pending U.S. patent application Ser. No. 14/814,355, filed Jul. 30, 2015 (now U.S. Pat. No. 10,033,153), which claims benefit of priority to Provisional Patent Application Ser. No. 62/062,429, filed Oct. 10, 2014, and Ser. No. 62/031,790, filed Jul. 31, 2014, and the entirety of each and all of the aforementioned provisional and nonprovisional applications are incorporated by reference herein for all purposes to the extent same is consistent herewith.

TECHNICAL FIELD

The following description relates to monitoring. More particularly, the following description relates to monitoring using fiber-optic sensors.

BACKGROUND

Precise control of internal chamber conditions, including stability and uniformity of pressure, flow rate and/or temperature, is useful in semiconductor processing. Test wafer devices ("test wafers") are used in calibrating semiconductor industry processing chambers. Such test wafers conventionally have a luminescent material, such as a phosphor, that emits optically detectable electromagnetic radiation ("optically detectable signal") based on the temperature of such luminescent material. However, luminescent material may be sensitive to other electromagnetic radiation generated in a chamber, as such RF, UV and other electromagnetic radiation, which may cause interference in detection of such an optically detectable signal. This along with other limitations associated with luminescent material sensors, and systems associated therewith, makes their use problematic. Additionally, temperature and other conditions within a processing chamber may be monitored during manufacturing. It would be useful and desirable to provide more sensors for such monitoring of temperature and/or other conditions in a processing chamber.

SUMMARY

An apparatus relates generally to a test wafer. In such an apparatus, there is a platform. An optical fiber with Fiber Bragg Grating sensors is located over the platform. A layer of material is located over the platform and over the optical fiber.

An apparatus relates generally to a processing chamber. In such an apparatus, the processing chamber has a pedestal with at least one lift pin of a plurality of lift pins configured to include an optical eye and an optical waveguide for optical communication.

An apparatus relates generally to another processing chamber. In such an apparatus, the processing chamber has a chuck and a showerhead or a lid. At least one of the chuck, the showerhead, or the lid has at least one optical fiber with sensors.

A method relates generally to monitoring or calibrating a processing chamber. In such a method, the processing chamber has therein an optical fiber with sensors configured for different center frequencies for modulation responsive to at least temperature. A broadband light source is optically transmitted from a light-source based detection system to the optical fiber. Reflected light is optically received from the optical fiber to the light-source based detection system. The reflected light is processed by the light-source based detection system to generate at least temperature related data therefrom.

Other features will be recognized from consideration of the Detailed Description and Claims, which follow.

BRIEF DESCRIPTION OF THE DRAWINGS

Accompanying drawings show exemplary apparatus(es) and/or method(s). However, the accompanying drawings should not be taken to limit the scope of the claims, but are for explanation and understanding only.

FIG. 2-1 is a block-perspective side view depicting an exemplary test wafer.

FIG. 2-2 is a cross-sectional view of a portion of a retention/alignment ring.

FIGS. 3-1 through 3-3 are optical signal-block diagrams depicting cross-sectional views of respective exemplary optical test systems.

FIGS. 5-1 through 5-3 are a block-sectional diagrams depicting examples of respective semiconductor processing chamber systems ("processing chambers").

FIG. 6-1 is a block diagram of a sectional side view depicting an exemplary lid assembly.

FIG. 6-2 is a top-down revealed view depicting an exemplary enclosed portion of an optical fiber on a lower protective layer.

FIG. 7-1 is a block diagram depicting an exemplary fiber-optic strain system.

FIG. 7-2 is a block diagram depicting an exemplary fiber-optic strain ("FOS") system.

FIG. 9-1 is a block diagram of a perspective view depicting an exemplary patch attached to a host structure.

FIG. 9-2 is a block diagram of a cross-sectional view along A-A of the patch of FIG. 9-1.

FIG. 11-1 is a block diagram depicting an exemplary single-channel laser tracking-based fiber optic voltage conditioning system.

FIG. 11-2 is a block diagram depicting an exemplary multichannel fiber optic voltage conditioning ("FOVC") system.

DETAILED DESCRIPTION

In the following description, numerous specific details are set forth to provide a more thorough description of the specific examples described herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Exemplary apparatus(es) and/or method(s) are described herein. It should be understood that the word "exemplary" is used herein to mean "serving as an example, instance, or illustration." Any example or feature described herein as "exemplary" is not necessarily to be construed as preferred or advantageous over other examples or features.

Before describing the examples illustratively depicted in the several figures, a general introduction is provided to further understanding.

Fiber Bragg Gratings ("FBGs") may be used in a sensing system. A Fiber Bragg Grating ("FBG") sensor array may be interrogated by a broadband light source-based sensing system for temperature and strain sensing and/or a laser-based detection system for acoustic emission sensing. Such systems are described in additional detail in U.S. patent application Ser. No. 14/814,355, filed Jul. 30, 2015, and Ser. No. 15/458,311, filed Mar. 14, 2017, each of which is incorporated by reference as though fully set forth herein in its entirety for all purposes as indicated above. Each such sensing and detection systems may generally be thought of as a light source-based detection system, as described below in additional detail.

Figure 1:
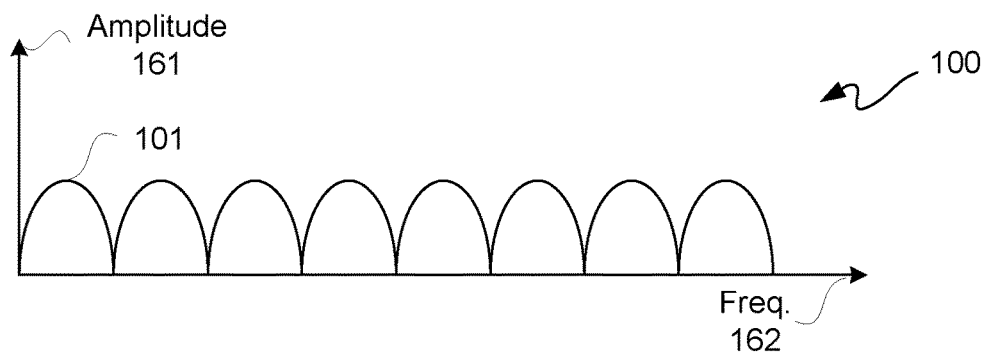
FIG. 1 is a signal diagram depicting an exemplary FBG signal.

An optical fiber may include multiple FBG sensors at different wavelengths. FIG. 1 is a signal diagram depicting an exemplary FBG signal 100. FBG signal 100, which has for a horizontal or x-axis frequency 162 and a vertical or y-axis amplitude 161, represents multiple FBG sensors in an optical fiber, where each wavelet or signal notch 101 has a corresponding center frequency, which may be sensitive to temperature, strain, and/or pressure. A shift in frequency of a center frequency of a wavelet or signal notch 101 may be related to a change in temperature, strain, and/or pressure. As described below in additional detail, an optical fiber with a number of FBG sensors, such as 17 or more FBG sensors for example, may be used. Each of such FBG sensors may be configured for a different center frequency or wavelength, and so such FBG sensors may be used to provide 17 or more different wavelets or signal notches 101. Each of such 17 or more wavelets or signal notches 101 may be individually modulated responsive to pressure, strain, and/or temperature such corresponding 17 or more FBG sensors experience. Though an example of 17 or more different wavelets or signal notches 101 is described, in other examples fewer than 17 different wavelets or signal notches 101 may be used.

For example, if pressure is held constant, changes in temperature at 17 or more locations corresponding to positions of such 17 or more FBG sensors in an optical fiber or other optical waveguide may be determined from corresponding center frequencies or wavelengths of such 17 or more wavelets or signal notches 101. If, however, pressure is not held constant, then any and all wavelength shifts of such 17 or more wavelets or signal notches 101 may be due to corresponding changes in pressure, strain, and/or temperature. Changes in pressure, strain, and/or temperature may be stored on a processing chamber-by-processing chamber basis in order to determine profiles for each such processing chamber, as well as correlate operation of processing chambers.

For an upstream broadband light source providing a broadband light signal for an optical fiber with FBGs, each FBG sensor acts as a filter. So, for example, an upstream FBG sensor may filter out a frequency or wavelength of such broadband light allowing remaining frequencies or wavelengths to pass. In the example below, FBGs filter wavelengths in a range of 1500 to 1600 nanometers. This range may be used to avoid a typical UV range emitted by a plasma in order to avoid a possibility of UV interference from such plasma emission. Thus, for example, a broadband light source coupled to an optical fiber with FBGs may have: a first of such FBGs configured to reflect back light at a wavelength of 1500 nanometers, a second of such FBGs configured to reflect back light at a wavelength of 1505 nanometers, and so on up to 1600 nanometers.

With such reflected light from each of such FBG sensors, an individual spectrum associated with each such reflected wavelength wavelet 101 peak may be detected for purposes of detecting changes in pressure and/or temperature corresponding to each shift in wavelength corresponding to such reflected wavelength. Along those lines, an interrogation system may be coupled to receive reflected wavelets or signal notches 101 from FBG sensors of an optical fiber. Such an interrogation system may be configured to detect wavelength shifts, such as in a range from 10 pico-meters to 90 nanometers for example. An interrogation system may be a broadband light-source based detection system, as described below in additional detail.

Along those lines, each FBG sensor may shift approximately 10 pico-meters per degree Celsius change. For approximately 60 FBG sensors for a 100 nanometer wavelength range, there may be a shift of approximately 1500 pico-meters, effectively about 150 degrees C. of shift, of spacing between adjacent pairs of such 60 FBG sensors. This spacing allows for all 60 FGB sensors to be monitored together, with sufficient spacing between adjacent FBG sensors to allow for movement, or expansion of FGB sensors, without negatively impacting sensing.

As described herein, a reflected spectrum from FBG sensors in an optical fiber sensed at an optically proximal end to a broadband light source is described. However, in another example, a reverse or inverse of a reflected spectrum from FBG sensors in an optical fiber sensed at an optically distal end to a broadband light source may be used in accordance with the description herein. Thus, a reflection mode or a transmission mode, or both, may be used for sensing changes in wavelengths corresponding to changes in pressure and/or temperature. For purposes of clarity by way of example and not limitation, a reflection mode is described below.

By using an optical fiber with multiple sensors, a single port and a single interface therefor, namely an opening of an optical fiber for receiving broadband light and detecting reflected FGB sensor wavelets 101, may be used. By having the capacity to sense multiple locations along an optical fiber with a single port opening and a single photo-detector interface, a test wafer may be more robust and have multiple sensors.

FBGs may be used for leak detection and/or other structural monitoring. Along those lines, a known failure mechanism of a wafer chuck in a chamber is a vacuum leak, where a wafer chuck may vent to atmosphere. However, it may take some time for a vacuum leak to grow large enough for a wafer chuck to vent to atmosphere, and a narrow band light source-based system, such as a laser-based system, may be used for fiber optic acoustic emission leak detection monitoring, and such fiber optic acoustic emission leak detection monitoring may be used with a test wafer as described herein for early detection of such leakage.

With the above general understanding borne in mind, various configurations for a test wafer, as well as other structures for fiber optic sensors, are generally described below. Though the description herein is for FBG sensors, it should be understood that other optical sensors in an optical fiber may be used in accordance with the description herein.

Figures 1, 2:
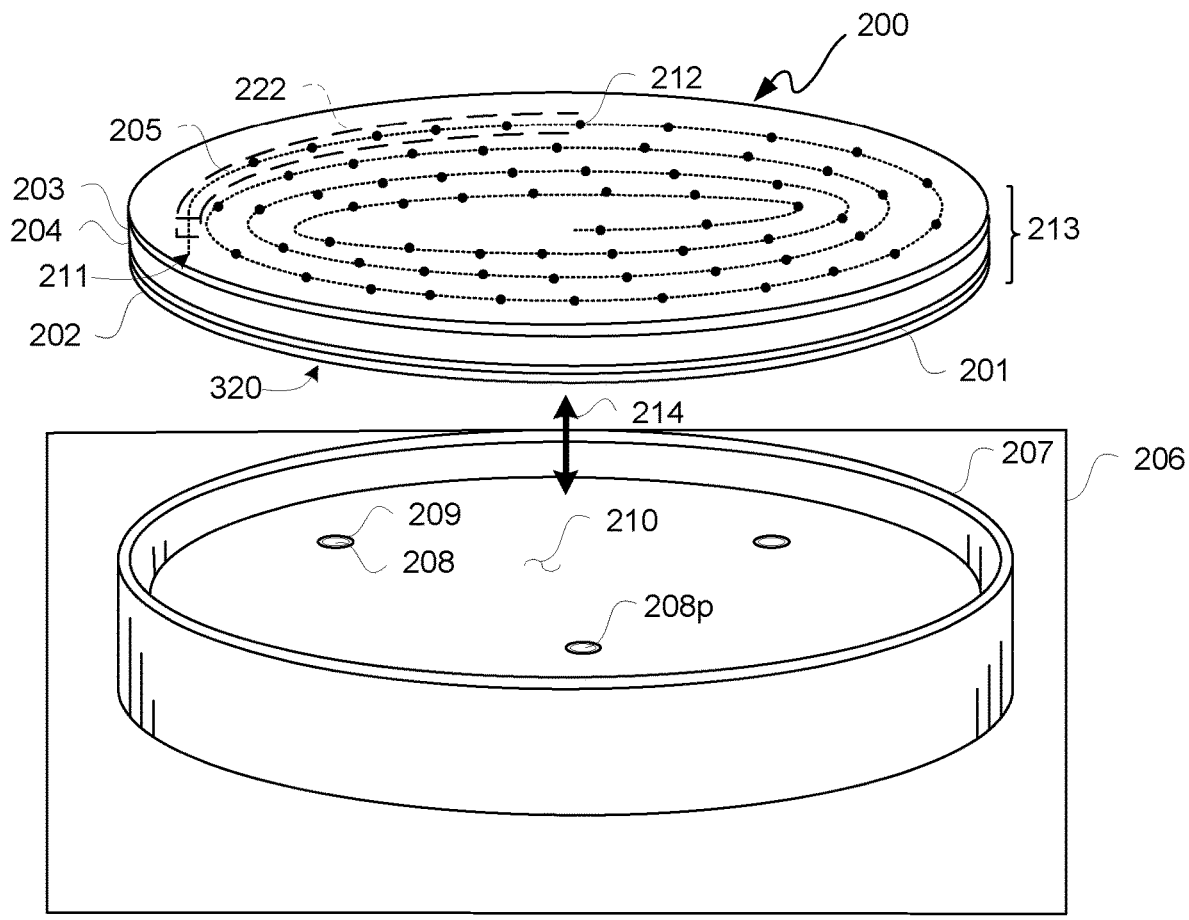
Figure 2:
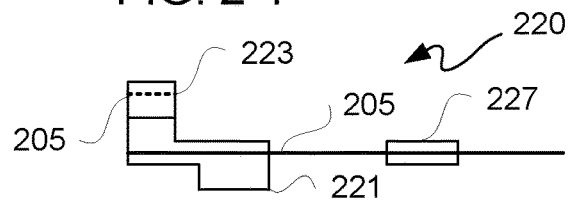

FIG. 2-1 is a block-perspective side view depicting an exemplary test wafer 200. This is just one example of a test wafer 200. In another example, a groove or other cavity, such as a channel 222 shown in part, may be formed in a polyimide wafer-shaped sheet to receive an optical fiber with FBG sensors, which can be adhered in such cavity, such as with an adhesive, to be below an upper surface of such polyimide wafer-shaped sheet. In another example, patches may be used to hold an optical fiber in place at different locations.

In this example, test wafer 200 may include a first low durometer layer 201, such as 4-5 mil silicone or other cured or uncured polysiloxane sheet, bonded onto a more rigid test wafer platform 202, such as a silicon wafer for example. In another example, layer 201 may be omitted and a coated optical fiber may be disposed over and directly on test wafer platform 202. Such first low durometer layer 201 may be smaller in diameter than such test wafer platform 202, such as by 1 to 15 millimeters, in order to more readily fit within a retention/alignment ring 207 of a wafer chuck, generally indicated with block 206.

As is known, wafer chuck 206 may be an electrostatic wafer chuck. Furthermore, wafer chuck 206 may be configured for heating and/or cooling wafer support surface 210, as well as vacuum ports (not shown), all of which is known.

An optical fiber 205 may be laid on such silicon sheet 201, followed by laying a second low durometer layer 203, such as another 4-5 mil silicone or other polysiloxane sheet, on and over such optical fiber 205 and onto such first low durometer layer 201. In another example, second layer 203 may be a polyimide layer. In yet another example, a second layer 203 may be reinforced with a synthetic fiber, such as kevlar for example. A portion of optical fiber 205 may extend out from test wafer 200 for subsequent interconnection, such as with a connector to a light-source based detection system external to a processing chamber, as described below in additional detail for embedded optical fibers, or a portion of optical fiber 205 may be vertically aligned for having an end thereof downward for alignment with an optical lift pin, as described below in additional detail.

Such optical fiber 205 between silicone sheets 201 and 203 may then be adhered to one another with a polyimide or other sealant 204 for at least sealing edges of such sheets and a gap therebetween, to provide a hermetic or environmental seal. Polyimide absorbs UV, and so optical fiber 205 having FGB sensors, some of which are generally indicated with dots 212, may be shielded from UV and other environmental factors along an edge or edges 213. Though the example of a cylindrically or circularly-shaped test wafer 200 is depicted, in another example a different shape may be used.

Optionally, in another example, a polytetrafluoroethylene (PTFE) layer may be used in addition to silicone sheet 203. In another example, a coated fiber or the like may be used instead of or in addition to using a protective layer 201 in order to mitigate against strain induced errors.

In this example, test wafer 200 may be loaded, such as with a robotic arm as is known, into a semiconductor or other processing chamber through a transfer chamber. Test wafer 200, like a production wafer, may be positioned for alignment, such as by having an alignment mark optically encoded on such test wafer 200. However, for a test wafer 200, such alignment may be for alignment to an optical lift pin 208p, as described below in additional detail. Conventionally, as much as a 100 micron misalignment is allowed, and so an optical lift pin 208p to optical fiber 205 opening end 211 alignment may operate with a misalignment of as much as 100 microns.

Lift pins 208 may rise toward such test wafer 200, and such robotic arm may release such test wafer 200 onto such lift pins 208. Such lift pins 208 may be lowered to lower such test wafer 200 onto a wafer support surface 210 of a wafer chuck 206. Even though a wafer chuck 206 is described, a susceptor may be used. Such lift pins 208 may further recess below such wafer support surface 210 creating a gap between a lower surface 320 of test wafer 200 and wafer support surface 210. In other words, lift pins 208 in this example are not in direct contact with test wafer 200 while test wafer 200 is in process or in use.

However, as described below in additional detail, test wafer 200 is in communication with an optical lift pin 208p during use of test wafer 200. Additionally, test wafer 200 may be completely passive, namely test wafer 200 may operate without a power source other than an optical signal passed from optical lift pin 208p, as described below in additional detail.

Recessed below an upper-inner wafer support surface 210 inside retention/alignment ring 207 of wafer chuck 206 may be a plurality of lift pins 208 in recesses 209 defined in wafer chuck 206. Lift pins 208 may be used for lowering test wafer 200 into position, namely into ring 207, and for raising test wafer 200 out of ring 207, as generally indicated with arrow 214. One of such lift pins 208 may include an optical waveguide, namely optical lift pin 208p. An opening end 211 of optical fiber 205 may be aligned for optical communication across a gap, namely "free space", with optical lift pin 208p. In another example, lift pins 208 may stay in contact with test wafer 200, so as to have little to no gap.

Even though a spiral or spiral-like pattern is illustratively depicted for optical fiber 205, another geometric pattern, combination of geometric patterns, random positioning pattern, and/or a combination of any of the above, may be used. However, for purposes of clarity by way of example and not limitation, it shall be assumed that a spiral pattern is used.

Lift pins 208 are conventionally made of sapphire, alumina, or quartz. Optical lift pin 208p is configured as an optical waveguide for providing broadband light from a broadband light source to an opening end 211 of optical fiber 205. Optical lift pin 208p is further configured as an optical waveguide for receiving reflected wavelets or signal notches 101 for detection by a downstream interrogation system.

At this point, it should be understood that only optical components are present in test wafer 200. Along those lines, there are no electronic components in test wafer 200 in contrast to a conventional test wafer. As strong RF fields may be generated in some chambers, including without limitation plasma chambers, which quickly degrade electronic components, avoidance of such components in a test wafer may be useful. In other words, an optical-only passive test wafer without electronic components embedded therein may have a longer life cycle in comparison to a test wafer with embedded electronic components.

In another example, an optical lift pin 208p may be used with or omitted in favor of a more direct connection. For example, a well-known fiber optic feedthrough connector may be used to provide an optical feed through, such as from internal vacuum pressure in a processing chamber to external pressure with respect to a processing chamber. Examples of known fiber optic connectors include FC/PC and FC/APC connectors.

FIG. 2-2 is a cross-sectional view of a portion of a retention/alignment ring 220. A two layer/piece retention/alignment ring 220 may be used instead of retention/alignment ring 207 of FIG. 2-1. Lower ring 221 of retention/alignment ring 220, which may be formed of quartz or other material, may include a passage for an optical fiber 205 with FBG sensors. An upper tuning ring 223, which may be formed of silicon carbide or another material, may rest on an upper surface of lower ring 221, and upper and lower rings 223 and 221 may be raised or lowered with lift pins. In another example, upper tuning ring 223 may include an optical fiber 205 with FBG sensors, and in yet another example, both tuning rings 221 and 223 may include an optical fiber 205 with FBG sensors. An end of optical fiber 205 may feed into a fiber optic connector 227, such as an FC/PC or FC/APC feedthrough connector.

Figures 1, 3:
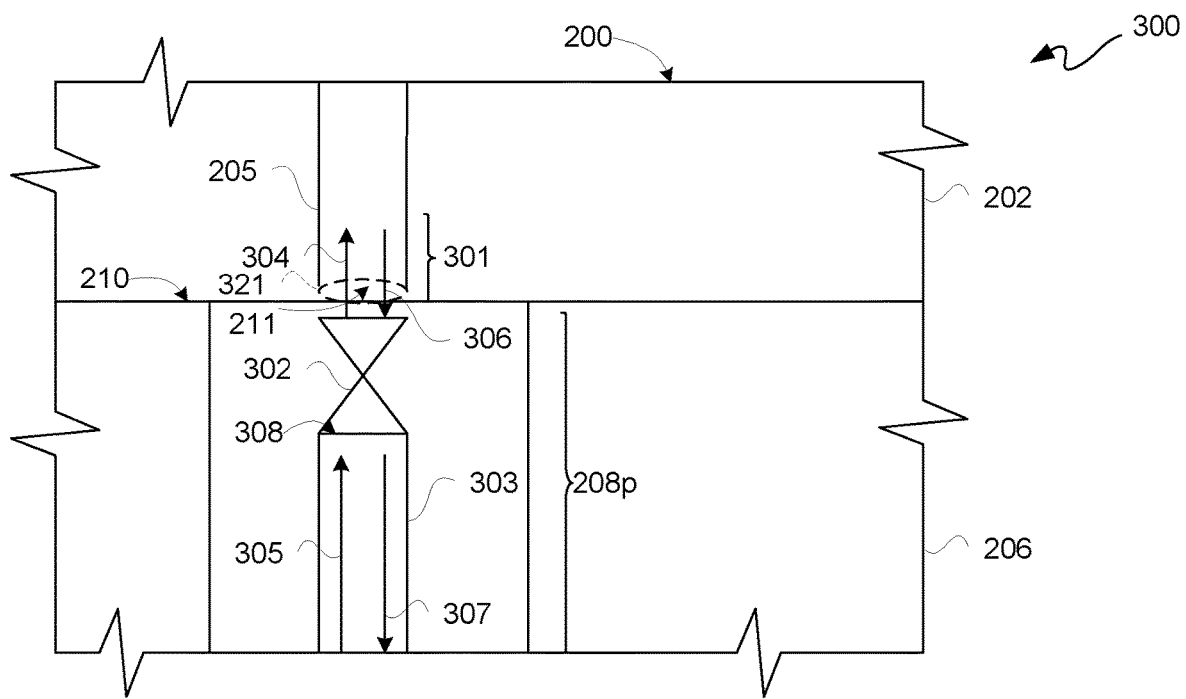
Figures 2, 3:
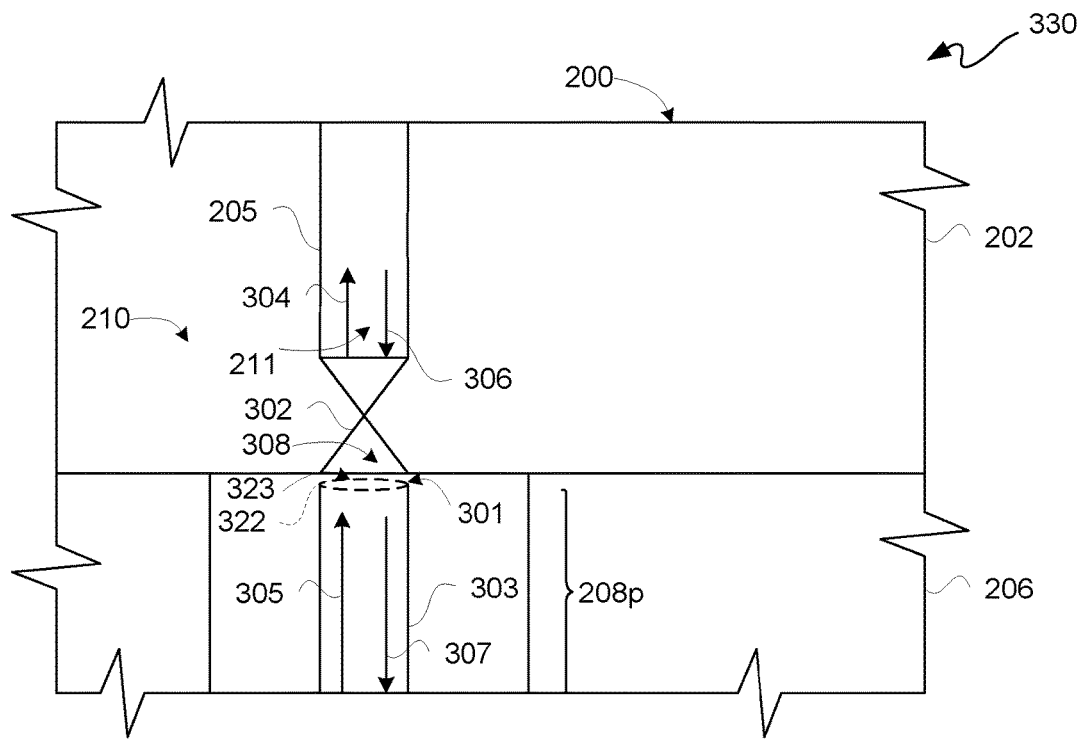
Figure 3:
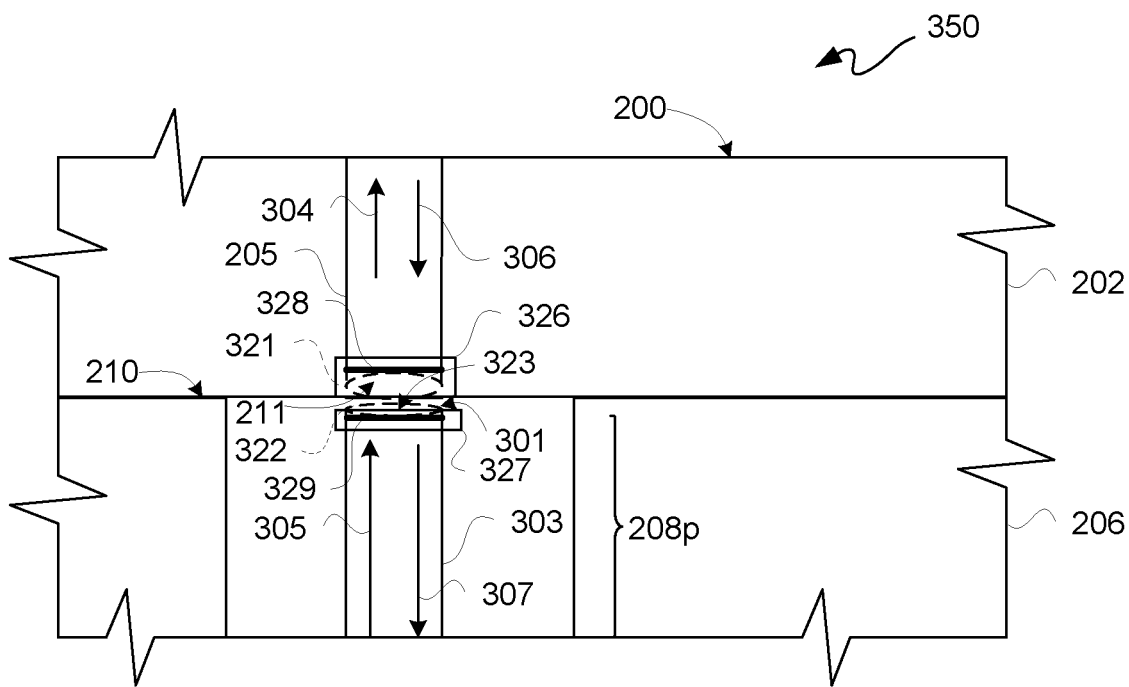

FIG. 3-1 is an optical signal-block diagram depicting a cross-sectional view of an exemplary optical test system 300. In optical test system 300, an optical lift pin 208p is for optical communication with an optical fiber 205 across a gap 301. Gap 301 may represent "free space" between an aligned optical lift pin 208p and an opening end 211 of optical fiber 205. This gap may represent some signal loss, which may affect length of optical fiber 205 and/or number of FBG sensors thereof. Along those lines, a distance such an optical eye 302 of optical lift pin 208p is recessed below a wafer support surface 210 of wafer pedestal or chuck 206 may vary between different types or different tools within a same type of semiconductor processing equipment. Moreover, such equipment is not limited to semiconductor processing, but may be used in formation of solar panels or other electronic components.

Broadband light, generally indicated with arrow 305, is provided via an optical waveguide 303 of optical lift pin 208p to an optical "eye" 302 of optical lift pin 208p. Optical "eye" 302 may be a configuration of one or more lenses for collimating broadband light 305 into transmitted light 304 for transmission across gap 301 for entry via opening end 211 of optical fiber 205. Opening end 211 of optical fiber 205 may optionally include a taper and lens 321. Such an optional lens 321 may be formed as part of optical fiber 205.

After being reflected by one or more FBG sensors 212, reflected light, as generally indicated with arrow 306, is reflectively transmitted across gap 301 to optical eye 302. Optical eye 302 may collimate reflected light 306 into collimated light 307 for communication via optical waveguide 303 for an interrogator system.

Accordingly, optical lift pin 208p may operate as a lift pin and an optical transceiver and bi-directional optical waveguide. However, in another configuration, a dedicated optical transceiver/bi-directional optical waveguide 208p may be used, independently from use of a lift pin 208.

FIG. 3-2 is the same diagram as in FIG. 3-1, except in this example optical eye 302 is in test wafer platform 202 of test wafer 200 of an exemplary optical test system 330. Test wafer platform 202 may be formed of a silicon or other material wafer with a through hole formed therein for receipt of optical eye 302. An open end 323 of optical waveguide 303 may be formed to include an optional taper and lens 322. Thus, an optical transceiver lens or lens assembly, such contained in and retained by optical eye 302, may form part of a test wafer 200. Moreover, a collimated-tapered fiber may be used for an optical waveguide 303. Along those lines, an end of an optical fiber used for optical waveguide 303 may have a lens formed at an opening end 308 thereof for providing all or a portion of optical "eye" 302.

FIG. 3-3 is a combination of an upper portion of FIG. 3-1 and a lower portion of FIG. 3-2 to provide an example of a single-mode fiber-to-single mode fiber optical test system 350. For optical communication across a gap 301, an opening end 211 of an optical fiber 205 may have an optional taper and a lens 321 in order to receive and collimate dispersed light 304 and transmit collimated reflected light 306.

Likewise, an opening end 323 of an optical waveguide 303, such as another optical fiber, may be aligned to face opening end 211, namely with sufficient overlap for optical communication across a gap 301. Such opening end 323 of an optical waveguide 303 may have an optional taper and a lens 322 in order to receive and collimate dispersed reflected light 307 and transmit collimated light 305.

Such taper and lenses 321 and 322 are optional, as for some applications gap 301 may be too small for sufficient dispersion to warrant a taper and lens at opposing opening ends of optical fibers. In above example with dispersion due to a gap 301, such taper may generally be to expand average fiber optical mode field diameter from 10 microns to approximately 1.3 millimeters with unchanged numerical aperture for the above example to receive dispersed light. Though such taper is present for transmission of light, such light is collimated upon exit with a lens. For optical alignment, an optical eye assembly 326 may surround an opening end 211 of optical fiber 205, and an optical eye assembly 327 may surround an opening end 323 of optical fiber 303.

Furthermore, in the above example for having one fiber generally orthogonal to another fiber with respect to internal communications of optical signals, one or both such lenses 321 and 322 may include a reflective surface, such as a mirrored surface such as surfaces 328 and 329, respectively, to re-direct light, for a 90 degree or right angle redirection. For example, Single Mode SMF-28 fiber of gold coated fiber with Fiber Bragg Grating of 5 mm in length with separation of 2 cm of 17 or more, such as 50 for example, channel/arrays with pitch of 2 cm and one side perpendicular lensed fiber with 500 μm collimated beam diameter and stripped length of 10 to 12 mm and wavelength between 1510 and 1590 nm may be used. For such a fiber, other or distal end may be plain cleaved, and remaining fiber may be bare for an overall length of approximately 1.3 meters.

For this separation between each FBG sensors, a 2 cm spacing between each adjacent gratings may be used to minimize optical crosstalk. However, in another example, a minimum spacing may be 1 cm between adjacent gratings. Furthermore, a fiber polyimide coating stripping and a gold overcoat coating may be separate operations, designed to enhance mechanical strength for fiber handling. However, a polyimide stripping may be used without a gold coating to minimize thermal crosstalk.

Figure 4:
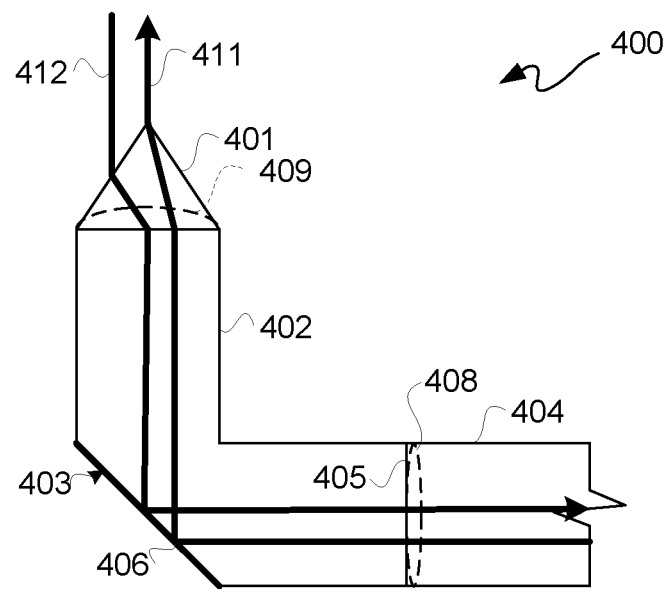
FIG. 4 is a perspective-optical signal diagram depicting a cross-sectional view of an exemplary bi-directional prism assembly.

However, in another example, a prism may be used with an optical fiber. FIG. 4 is a perspective-optical signal diagram depicting a cross-sectional view of an exemplary bi-directional prism assembly 400. Bi-directional prism assembly 400 may include a conical or conical-like tip 401 configured to collimate light, such as for an optical transmission 411 to free space and an optical reception 412 from free space.

An optical prism waveguide portion 402 of bi-directional prism assembly 400 may be fused, such as with ARC or other fusion 405, to an optical fiber 404. A right angle surface 403 of bi-directional prism assembly 400 have a reflective coating 406, such as to provide a mirror, for re-directing optical signals 411 and 412. In another example for free space transmission with a significant gap between two single mode fibers, more than one prism can be used as beam shaper to significantly increase a beam size for effective mode overlap to enhance coupling alignment tolerance. For example, spherical or aspherical lenses together with a pair of prisms, or cascaded prisms, can be used to collimate an exiting beam from a first fiber, expand beam size, and redirect the beam through a gap, then reduce the beam size, and focus the beam to the second fiber. This combined lens and cascaded prisms facilitates free space transmission between two non-colinear single mode fibers with high coupling alignment tolerance.

An optical transmission signal 411 may be 10 microns wide at exit for example; however, such optical transmission signal 411 may diverge or disperse in free space into a much wider signal. Furthermore, other sizes of optical transmission widths may be used in other examples.

An optional lens 322 may be used to receive such dispersed optical transmission signal 411 for collimation into an optical fiber 205. Likewise, tip 401 may be configured to receive an optical reflection transmission 412, collimated at exit from an optional lens 322 and dispersed across free space for reception at tip 401, and then tip 401 may collimate such received dispersed optical reflection transmission 412 from FBG sensors 212 of an optical fiber 205.

Optionally, optical prism waveguide 402 may incorporate a lens 409 and/or a lens 408. Optical prism waveguide 402 may functions as a compact beam shaping component such as expanding or reducing a collimated beam size and/or redirecting a beam's direction. A lens 409 optionally can be bonded or integrally made as part of optical prism waveguide 402 as a single element unit. Optionally, an optical fiber 404 may be with integrated ball lens 408, which then can be combined with a optical prism waveguide 402 for further expanding a beam size and bending or redirecting, such as by 90 degree, a beam for enhancing orthogonal coupling alignment tolerance.

FBG sensors in optical fibers may be used with an interrogation system. An FBG sensor array may be interrogated by a broadband light source detection system. In this example, an LED may be used as a broadband light source. Furthermore, because FBGs do need the signal strength that other devices do in order to operate, a larger free space gap may be tolerated. Furthermore, because only shifts in wavelength may be detected to determine a pressure and/or temperature change, weak signals may be used for such detection. For example, up to a 90% signal loss may be tolerated in such a system, because a frequency shift and not an amplitude loss is detected.

Returning to FIG. 2, a test wafer 200 may be used in a processing chamber. In this example, a bi-directional 214 arrow indicates a device in a through hole in a silicon wafer substrate base, such as of a wafer chuck, for engagement with a test wafer platform 202.

In this example, a bi-directional prism optical interface, such as of FIG. 4, is used, as generally indicated with such a bi-directional arrow 214 disposed in such a silicon wafer substrate base. Additionally, such bi-directional prism optical interface may be used to collimate light in an upward direction for a test wafer optical fiber 205, as well as in a downward direction for communication via an optical waveguide 303, such as an optical fiber. Along those lines, a bi-direction prism optical interface is an example of an optical eye 302. Such a bi-directional prism may be for transmission of collimated light for communication with a test wafer and/or to receive collimated light for downstream communication to a photo-sensitive array of an interrogation system.

In this example, layers 201 and 203 are respective low durometer vulcanized fiber layers. Furthermore, in this example, a polyimide or other corrosion protection layer 204 covers an upper layer 203 as well as sides of layers 201 and 203. Covering layers 201 and 203 with a polyimide layer for example may be useful to capture any outgassing of layers 201 and 203. Along those lines, an underside of layer 201 may be exposed, as vacuum ports of a wafer chuck may be used to remove such outgassing from negatively impacting chamber chemistries. However, in another example, all of test wafer 200 may be covered with a polyimide layer 204, except where bare optical fiber 205 opening end 211 is accessible to incoming and outgoing light. Bare fiber can optionally be inserted inside a hollow metal tube with inner diameter slightly larger than the fiber diameter itself, such as between 300 um and 500 um, to allow for FBG to freely expand inside such a metal tube without any or any significant restriction imposed by such metal tube. Such a metal or other shielding tube can be a UV barrier or additional UV barrier with respect to protecting light in an optical fiber. Moreover, such a metal or other shielding tube may provide a pressure isolation layer for FBG sensors for focusing on temperature sensing.

Even though this example is for 48 FBG sensors using one of three lift pins, in another example more FBG sensors per lift pin may be used. Furthermore, in another example, more than one lift pin and more than one optical fiber may be used. However, use of multiple lift pins and multiple optical fibers may be understood from a single lift pin and single optical fiber example, except an optical multiplexer may be used to multiplex multiple signals input to an interrogation system.

An optical patch cord may run through a raceway to an interrogation system. Because a lift pin under carriage frame is generally driven from the bottom, a patch cord with some amount of slack may be used above such lift mechanism to track vertical movement up and down without binding such optical fiber. Additionally, an optical lift pin 208p may be a replaceable item, like a test wafer 200, after a number of uses in order to ensure a high quality of result.

While the above-description has generally been for a test wafer having an optical fiber with FBG sensors, use of FBG sensors in semiconductor processing and/or semiconductor processing calibration equipment is not limited to test wafers. As FBG sensors may be used for leak detection and structural monitoring, such FBG sensors may be used to determine if a chamber is structurally sound and/or leaking, such as leaking to atmosphere in a clean room. Along those lines, FGB sensors may be used in chamber shower heads, chamber walls, wafer pedestals, chamber lids, and/or wafer chucks, among other semiconductor processing equipment structures.

Figures 1, 5:
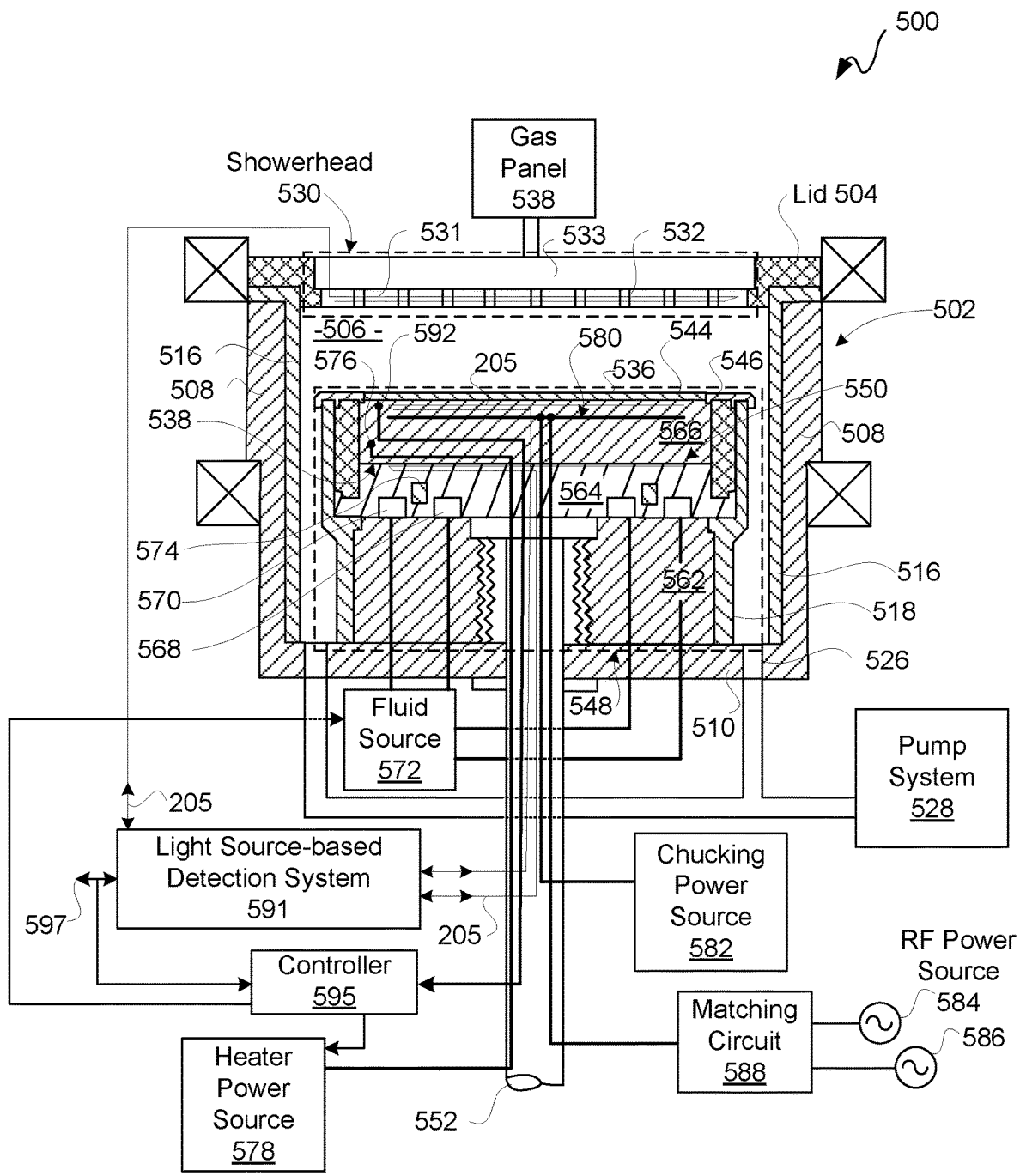
Figures 2, 5:
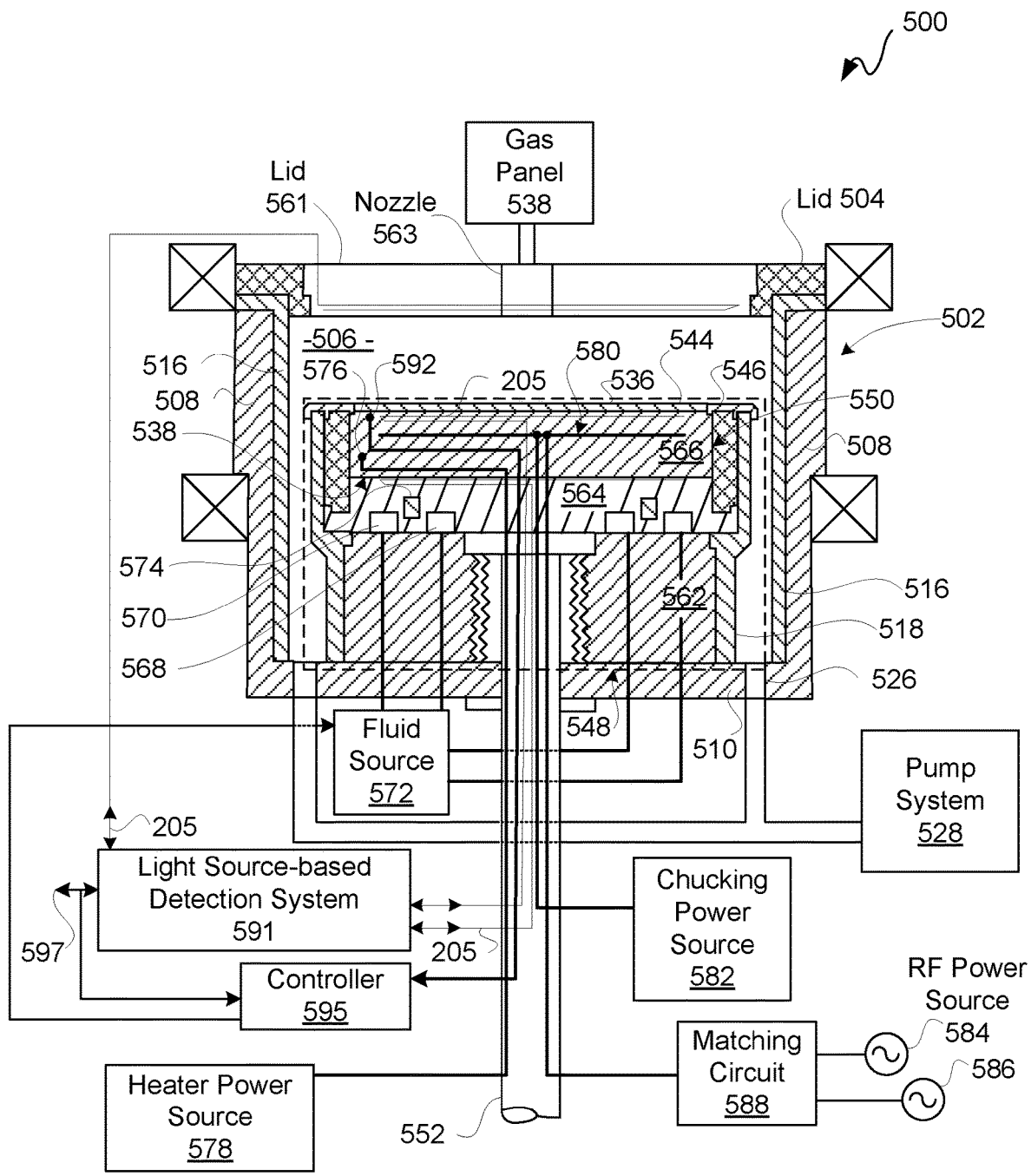
Figures 3, 5:
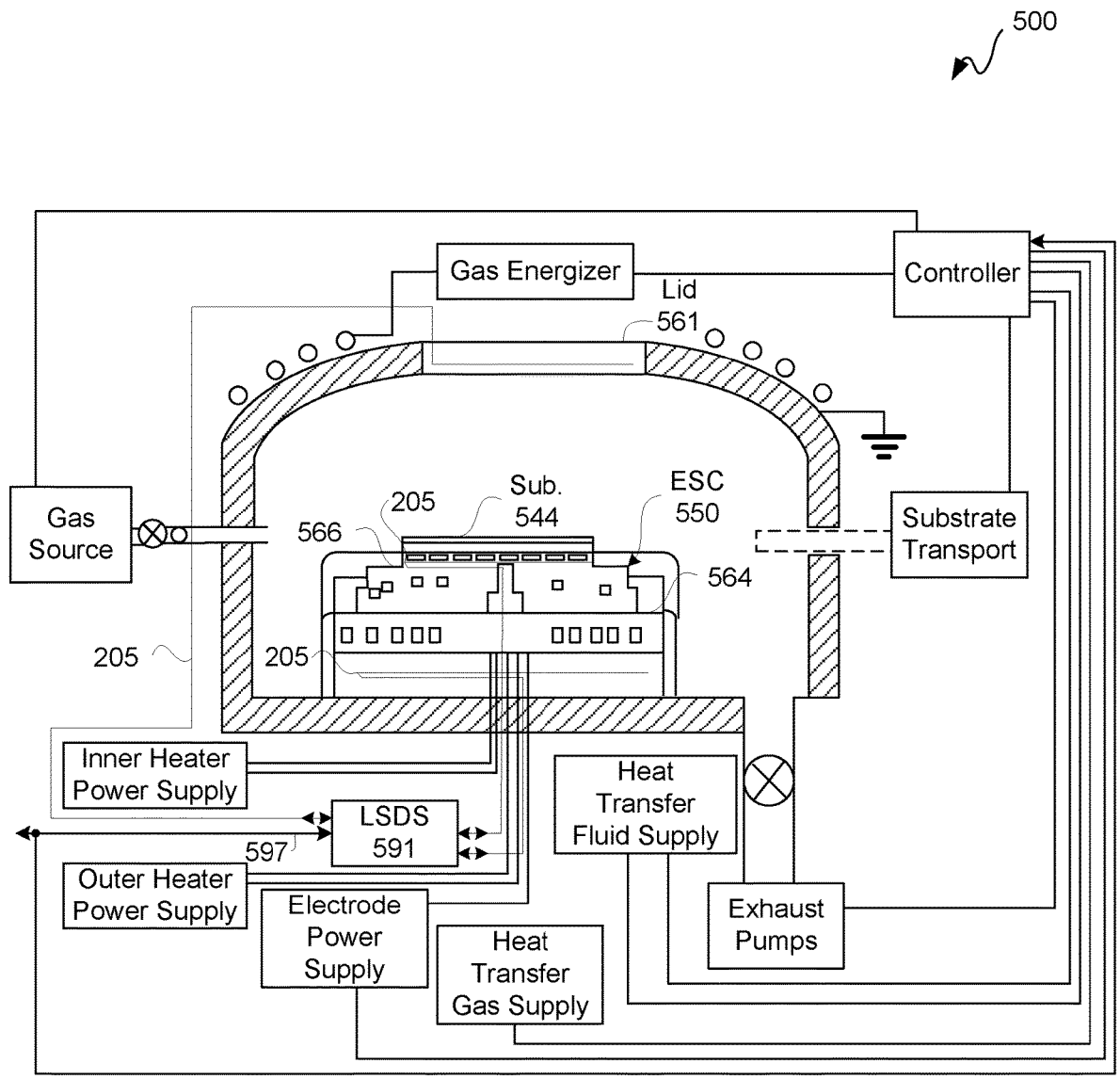

FIG. 5-1 is a block-sectional diagram depicting an example a semiconductor processing chamber system ("processing chamber") 500. A component in an interior volume 506 of processing chamber 500 is substrate support assembly 548, such as for supporting an in-process substrate 536 disposed in a retention ring 546. Substrate support assembly 548 may include an electrostatic chuck ("wafer cuck") for a wafer or other substrate for example. Even though a wafer chuck is described, a susceptor may be used. For purposes of clarity by way of example and not limitation, a substrate support assembly 548 may be allowed to have a helium leak rate for example of 1.5 SCCM (Standard Cubic Centimeters per Minute) or less for a lifespan thereof, generally measured in RFHrs (radio frequency hours).

Various manufacturing processes, including cleaning, may expose semiconductor process chamber 500 and components thereof, including substrate support assembly 548, to high temperatures, high energy plasmas, mixtures of corrosive gases, high stresses, near vacuum pressures, and combinations thereof. These extreme conditions may erode, corrode, and increase susceptibility to defects with respect to one or more of such processing chamber 500 components. Accordingly monitoring for structural and other defects due to erosion, corrosion, and/or general wear and tear may avoid costly damage to a chamber and/or products formed in such chamber. Along those lines, structural monitoring, leak detection, pressure monitoring, temperature monitoring, and other forms of monitoring and detection may be used.

Processing chamber 500 may be used for processes in which a corrosive plasma environment having plasma processing conditions is created in such chamber. For example, processing chamber 500 may be a chamber for a plasma etcher or plasma etch reactor, a plasma cleaner, and so forth. Examples of processing chamber 500 components include substrate support assembly 548, an electrostatic chuck (ESC), a ring (e.g., a process kit ring or single ring), a chamber wall, a base, a gas distribution plate, a gas distribution assembly ("showerhead") 530, gas lines, a nozzle, a lid, a liner, a liner kit, a shield, a plasma screen, a flow equalizer, a cooling base, a chamber viewport, a chamber lid 504, and so on.

In this example, processing chamber 500 includes a chamber body 502, a gas distribution assembly 530, and a chamber lid 504. Chamber body 502, gas distribution assembly 530, and chamber lid 504 define at least in part an interior volume 506 for processing.

Chamber body 502 generally includes sidewalls 508 and a bottom 510. Chamber body 502 may be fabricated from aluminum, stainless steel or other suitable material.

An outer liner 516 with respect to interior volume 506 may be disposed adjacent to interior surfaces of side walls 508 to protect chamber body 502. Outer liner 516 may be fabricated and/or coated with a coating, such as for example a plasma or halogen-containing gas resistant material. In an example, outer liner 516 is fabricated from aluminum oxide. In another example, outer liner 516 is fabricated from or coated with yttria, a yttrium alloy, or an oxide thereof.

Gas distribution assembly 530 may have multiple gas delivery holes or apertures 532 on a downstream surface of a gas distribution plate ("GDP") 531 of gas distribution assembly 530 to direct gas flow into interior volume 506. GDP 531 may be bonded to an aluminum showerhead base or an anodized aluminum showerhead base. GDP 531 may be made from Si or SiC, or may be a ceramic such as $Y_2O_3$, $Al_2O_3$, YAG, and so forth. Showerhead 530 and delivery holes 532 may be coated with a multi-component coating.

Additionally, gas distribution assembly 530 can have a center hole where gases are fed, such as through a ceramic gas nozzle, into an interior distribution region 533 of gas distribution assembly 530. Gas distribution assembly 530 may be fabricated and/or coated by a ceramic material, such as silicon carbide, yttria, or other material to provide resistance to halogen-containing chemistries to prevent or mitigate corrosion. In another example, gas distribution assembly 530 may be replaced by a lid and a nozzle. Any of gas distribution assembly 530 (or lid and/or nozzle), sidewalls 508 and/or bottom 510 may be coated to prevent corrosion. Gas distribution assembly 530 in this example is for a dielectric etch, namely etching of dielectric materials, in processing chamber 500.

For processing chamber 500 used for a conductor etch, namely etching of conductive materials, a lid may be used rather than a gas distribution assembly 530. Such a lid may include a center nozzle that fits into a center hole of such lid. Such lid may be a ceramic such as $Al_2O_3$, $Y_2O_3$, YAG, or a ceramic compound including $Y_4Al_2O_9$ and a solid-solution of $Y_2O_3$-$ZrO_2$. Such nozzle may also be a ceramic, such as $Y_2O_3$, YAG, or the ceramic compound including $Y_4Al_2O_9$ and a solid-solution of $Y_2O_3$-$ZrO_2$. Such lid, gas distribution assembly 530 (e.g., including showerhead base, GDP and/or gas delivery conduits/holes) and/or nozzle may all be coated with a multi-component coating.

An exhaust port 526 may be defined in bottom 510 of chamber body 502. Exhaust port 526 may provide a conduit between interior volume 506 and a pump system 528. Pump system 528 may include one or more pumps and throttle valves utilized to evacuate and otherwise regulate pressure in interior volume 506 of processing chamber 500. This pressure for semiconductor processing may be close to a vacuum, such as for example in a range of 0.1 to 20 millitorr ("mTorr"; 0.01 Pascals ("Pa") to 2.67 Pa).

Chamber lid 504 may be supported on one or more sidewalls 508 of chamber body 502. Chamber lid 504 may be opened to allow access to interior volume 506 of processing chamber 500 in some examples, and chamber lid 504 may be closed to provide a seal for processing chamber 500. A gas panel 538 may be coupled such as via a conduit to processing chamber 500 to provide process and/or cleaning gases to interior volume 506 through gas distribution assembly 530. In this example, gas distribution assembly 530 is part of chamber lid 504.

Examples of processing gases which may be used in semiconductor fabrication in processing chamber 500 include halogen-containing gases, such as $C_2F_6$, $SF_6$, $SiCl_4$, HBr, $NF_3$, $CF_4$, $CHF_3$, $CH_2F_3$, $Cl_2$ and $SiF_4$, among others, and other gases such as $O_2$, or $N_2O$. Examples of carrier gases include $N_2$, He, Ar, and other gases inert to process gases (e.g., non-reactive gases). Examples of cleaning gases that may be used to clean components in interior volume 506 include chlorine, fluorine, bromine, and other corrosive gases that are usable to produce a plasma suitable for cleaning.

Substrate support assembly 548 is located in interior volume 506 of processing chamber 500 below a gas distribution assembly 530 or a lid. Substrate support assembly 548 may be used to hold a substrate during processing. Substrate support assembly 548 may include an electrostatic chuck bonded to a cooling plate.

An inner liner 518 with respect to outer liner 516 may be coated on a periphery surface of substrate support assembly 548. Inner liner 518 may be a halogen-containing gas resistant material such as those discussed with reference to outer liner 516. In one example, inner liner 518 may be fabricated from the same materials as outer liner 516.

In this example, substrate support assembly 548 includes a lower mounting plate 562 with a threaded through hole for threaded engagement with a pedestal 552. Substrate support assembly 548 further includes an electrostatic chuck 550. Pedestal 552 may be controllably raised, lowered, and/or rotated within interior volume 506 in order to raise, lower, and/or rotate electrostatic chuck 550

Electrostatic chuck 550 includes a thermally conductive base 564 bonded to an electrostatic body ("electrostatic puck") 566 via a bond 538. Electrostatic puck 566 may be fabricated from a ceramic material such as aluminum nitride (AlN) or aluminum oxide ($Al_2O_3$). Mounting plate 562 may be attached or coupled to bottom 510 of chamber body 502. Mounting plate 562, and bottom 510, may include passages for routing utilities (e.g., fluids, power lines, sensor leads, etc.) to the thermally conductive base 564 and electrostatic puck 566. Along those lines, sensor leads may include fiber optic lines in accordance with the description herein.

Thermally conductive base 564 and/or electrostatic puck 566 may include one or more optional embedded heating elements 576, embedded thermal isolators 574 and/or conduits 568, 570, such as to control a lateral temperature profile of support assembly 548. Along those lines, conduits 568, 570 may be coupled to a fluid source 572 for flow of fluid to circulate a temperature regulating fluid through conduits 568, 570. An embedded thermal isolator 574 may be located at least in part between conduits 568, 570 in this example.

Heater 576 may be regulated by a heater power source 578. Circulation of fluid through conduits 568, 570 and regulation of heater 576 may be utilized to control temperature of thermally conductive base 564, such as through thermal conduction, to heat and/or cool electrostatic puck 566 and a substrate (e.g., a wafer) being processed. Temperature of electrostatic puck 566 and thermally conductive base 564 may be monitored using a plurality of temperature sensors 592, which may be monitored using a thermal controller 595, and thermal controller 595 may be used to control heater power source 578 and fluid source 572 to regulate thermal conditions of electrostatic puck 566 and/or thermally conductive base 564.

Instead of or in addition to temperature sensors 592, one or more optical fibers or fiber optic cables 205 having FBG sensors may be located in electrostatic puck 566, a retention/alignment ring (as previously described), and/or thermally conductive base 564. Optionally, a fiber optic cable 205 having FBG sensors may be located in gas distribution assembly 530 and/or a chamber lid 504. Such one or more fiber optic cables 205 may be coupled to a light source-based detection system 591 to generate data 597 in response. Optical fiber 404 of FIG. 4, not shown in this figure for clarity, may extend from electrostatic chuck 550 down to be coupled to light source-based detection system 591. Reflections from a FBG sensor array may be interrogated by a laser-based detection system such as described in additional detail in U.S. patent application Ser. No. 14/814,355, filed Jul. 30, 2015, and Ser. No. 15/458,311, filed Mar. 14, 2017, each of which is incorporated by reference as though fully set forth herein in its entirety for all purposes, and such laser-based detection systems may be used for a light source-based detection system 591.

Data 597 may be used to indicate temperature detected using such FBG sensors, and such data 597 or results therefrom may be fed to thermal controller 595. Thermal controller 595 may be used to control heater power source 578 and fluid source 572 to regulate thermal conditions of electrostatic puck 566 and/or thermally conductive base 564.

Thermal data and/or other information, such as pressure, flow rate, leak detection and/or structural information, in data 597 may be provided to a computer system for monitoring temperature, flow rate, structural integrity, and/or pressure for processing chamber 500. Along those lines, even though FBG sensors in one or more fiber optic cables 205 may be located within processing chamber 500, optionally there may be FBG sensors in one or more fiber optic cables 205 external to processing chamber 500, such as for sensing acoustic emissions for leak detection for example. Moreover, an embedded or enclosed portion of a fiber optic cable or optical fiber 205, whether in an electrostatic puck 566, thermally conductive base 564, gas distribution assembly 530, or chamber lid 504, may be generally disposed in a spiral, spiral like, or other pattern as described herein.

Electrostatic puck 566 may further include multiple gas passages such as grooves, mesas and/or other surface features that may be formed in an upper surface of electrostatic puck 566. Along those lines, a fiber optic cable 205 may be positioned in grooves or other surface features formed in an upper surface of electrostatic puck 566. Such gas passages may be coupled to a fluid source 572, such as via holes drilled in electrostatic puck 566 for passage of a thermally conductive gas. In operation, gas may be provided at a controllable pressure into such gas passages to enhance thermal transfer between electrostatic puck 566 and a chucked substrate 544. In addition to fiber optic cable 205 being used to sense temperature of electrostatic puck 566 for example, such fiber optic cable 205 may be positioned to sense temperature and/or flow rate of gas moving in such grooves and/or other surface features.

Electrostatic puck 566 includes at least one clamping electrode 580 controlled by a chucking power source 582. Electrode 580, or other electrode disposed in puck 566 or base 564, may further be coupled to one or more RF power sources 584, 586 through a matching circuit 588 for maintaining a plasma formed from processes and/or other gases within processing chamber 500. RF power sources 584, 586 may generally capable of producing RF signal having a frequency from about 50 kHz to about 3 GHz and a power of up to about 10,000 Watts.

Substrate 544 may have a disc shape, a flat square shape, a flat rectangular shape, or other appropriate shape. Substrate 544 may include a conductive portion that allows substrate 544 to be secured or chucked by electrostatic chuck 550 during a semiconductor fabrication or chamber cleaning process.

FIG. 5-2 is the block-sectional diagram of FIG. 5-1 depicting another example of a processing chamber 500. In this example, gas distribution assembly 530 is replaced with a chamber lid 561. Chamber lid 561 may have centrally disposed therein a nozzle 563 coupled at an end for gas(es) ("gas") flow from gas panel 538. Another end of nozzle 563 may be exposed to interior volume 506 for spraying or otherwise distributing gas flow in interior volume 506. Other details regarding processing chamber 500 are the same as in processing chamber 500 of FIG. 5-1, and thus are not repeated. Optionally, a fiber optic cable 205 having FBG sensors may be located in chamber lid 561, and information from such FBG sensors may be coupled to light source-based detection system 591 for generating thermal data or other information in data 597, which may be provided to a computer system for monitoring temperature, flow rate, structural integrity, and/or pressure for processing chamber 500.

Processing chambers 500 of FIGS. 5-1 and 5-2 are examples representative of etch or deposition chambers. Known details regarding processing chambers 500 are not described in unnecessary detail for purposes of clarity and not limitation. Along those lines, even though particular examples of processing chambers 500 are depicted, other designs of processing chambers 500 may have coupled thereto a light source-based detection system 591 by one or more fiber optic cables 205 having FBG sensors. Such fiber optic cables 205 may be located in electrostatic puck 566, thermally conductive base 564, gas distribution assembly 530/chamber lid 561, and/or elsewhere in a processing chamber 500. Such fiber optic cables 205 in puck 566, thermally conductive base 564, and/or gas distribution assembly 530/chamber lid 561 may have a spiral pattern or spiral-like pattern, such as for example as in FIG. 2.

FIG. 5-3 is a block-sectional diagram depicting yet another example of a processing chamber 500. Processing chamber 500 is an etcher, which in this example is representative of a Decoupled Plasma Source chamber, also known as an inductively coupled plasma etch chamber. Known details regarding processing chamber 500 are not described in unnecessary detail for purposes of clarity and not limitation. Along those lines, even though an inductively coupled plasma etcher is depicted, a capacitively coupled parallel plate etch chamber, a magnetically enhanced ion etch chamber, or other etch processing chambers 500 may be used with fiber optic cables 205 having FBG sensors, as described herein. Such one or more fiber optic cables 205 may be coupled to a light source-based detection system 591 for generating data 597, where such fiber optic cables 205 may be located in electrostatic puck 566, thermally conductive base 564, chamber lid 561, and/or elsewhere in a processing chamber 500. Such fiber optic cables 205 in puck 566, thermally conductive base 564, and/or showerhead chamber lid 561 may have a spiral pattern or spiral-like pattern, such as for example as in FIG. 2.

Precise control of internal chamber conditions, including, temperature, pressure/vacuum, gas flow, leakage of vacuum and/or gases, spectral characteristics, vibration/acoustics, chemical composition, and/or thermodynamic uniformity may be used for semiconductor processing. A test apparatus, such as a Test Wafer, with FBG sensors in an optical fiber 205 and/or a fiber optic cable 205 which may be a bi-directional optical cable, built into a process chamber 500 can be used for both calibration and/or monitoring of existing or permanently installed peripheral process control components, such as but not limited to heaters, sensors, flow meters, and/or RF generators as used in a processing chamber 500. An optical fiber 205 and/or a fiber optic cable 205 may be interconnected to light source-based detection system 591 directly or via an FC-APC or other optical connection interface. In this example, optical fiber 205 is a bi-directional optical cable, where reflections from FBG sensors are used in response to laser-beam generated signals. Along those lines, only one end of optical fiber 205 is connected to light source-based detection system 591, as reflections may be used. However, in another implementation, a negative signature of such reflections may be used, namely by having both ends of fiber optic cable 205 interconnected to light source-based detection system 591. Use of these and such peripheral process control components may combine to create a uniform plasma or other semiconductor processing environment within a chamber for a wafer on a pedestal or chuck, as well as for the use of capturing data that can be used to determine certain trends of these peripherals. This captured information may allow chamber operators to make improvements that can both improve quality and/or volume of a wafer's yield of integrated circuit dies. A wafer may have integrated circuit dies, such as processors, microcontrollers, memory, optical mux/demux, waveguides, and other integrated circuits and/or other discrete devices, which are used in today's global industries. Such global industries include cellular phones, tablets, notebook computers, onboard space rocket/satellite telemetry control computers, and missile guidance systems, among others.

Test wafers as described here use FBG sensors, such as for capturing one or more aforementioned process control parameter data points. Moreover, such FBG sensors do not suffer from one or more limitations associated with conventional use of mineral luminescent material and Fabry Perot-based systems. As the control parameters of a semiconductor process controller environment change, an optical signal and/or optical system is not limited by one or more limitations of mineral luminescent material-based and Fabry Perot-based systems, such as signal decay associated with conventional luminescent material, UV sensitivity associated with conventional luminescent material, and/or calibration parameter variation associated with Fabry Perot-based interferometry.

Additionally, RF immunity is useful in a semiconductor chamber due to an extremely high level of RF power used to strike an exothermic plasma which enhances certain processes such as ALD, PVD, CVD, EPI, Etch, and SRP, among others. An FBG-based optical system as described herein provides such immunity.

Figures 1, 6:
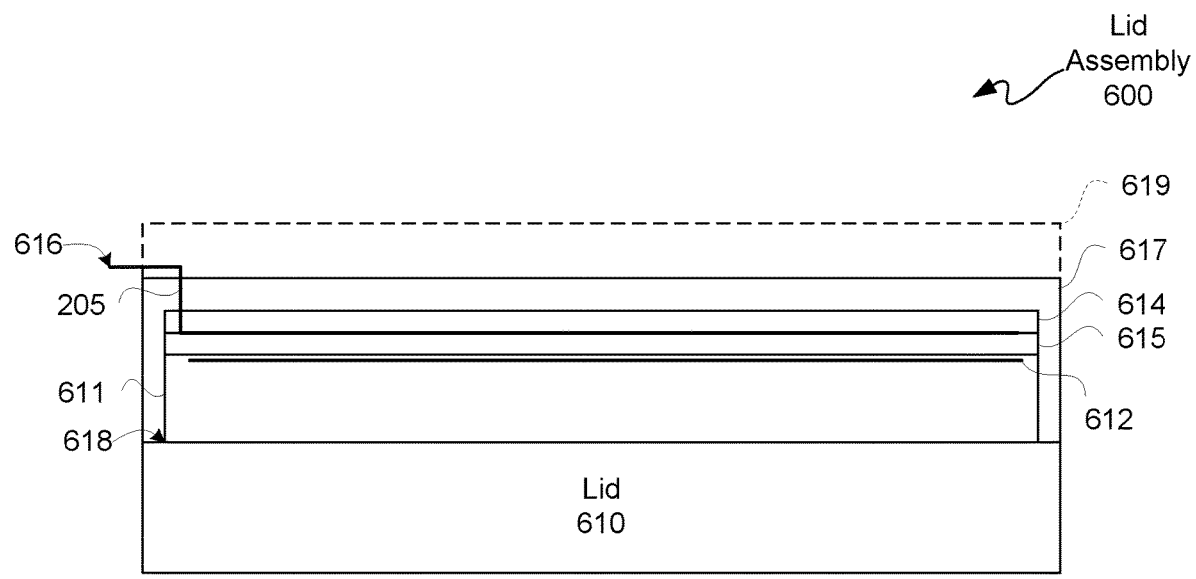
Figures 2, 6:
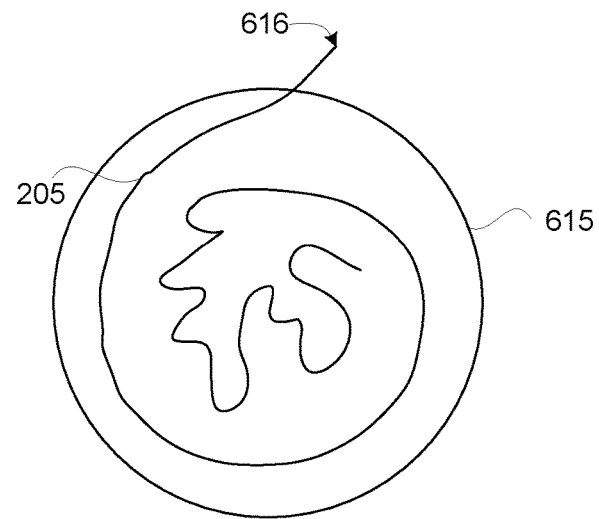

FIG. 6-1 is a block diagram of a side sectional view depicting an exemplary lid assembly 600. Lid assembly 600 may be used for a chamber lid 561 or a gas distribution assembly 530, as previously described. However, for purposes of clarity and not limitation, a chamber lid 561 of processing chamber 500 of FIG. 5-3 is assumed.

Lid assembly 600 includes a lid 610. Lid 610 may be made of an alumina for example. Lid assembly 600 may include a heater dielectric layer 611. Heater dielectric layer 611 may be made of a high durometer polyimide. A heating element 612 may be positioned in heater dielectric layer 611. Heating element 612 may be separately controlled (not shown in this figure). Heating element 612 may be a phosphor bronze alloy foil or film, where same is located in an etched channel in heater dielectric layer 611.

An optical fiber cable 205 may be sandwiched between a lower protective layer 615 and an upper protective layer 614 of a low durometer material, such as for example a vulcanized rubber. An end 616 of optical fiber 205 may be interconnected to a connector, such as with an FC-APC connector, for connection to a light source-based detection system 591. Optionally, a rigid top or cover plate 617, such as made of a polyimide, may be located over upper layer 614, as well as down along sides of protective layers 614 and 615 and sides of dielectric layer 611 for attachment to a surface 618 of lid 610. Optionally, an insulation layer 619 may be located over top 617.

FIG. 6-2 is a top-down revealed view depicting an exemplary portion of an optical fiber 205 on a lower protective layer 615. In this example, optical fiber 205 starts with a spiral or spiral-like pattern followed by what appears as a "random" pattern. However, such "random" pattern may be for working with particular locations of wavelength specific laser scribed FBG sensors along optical fiber 205. Thus, a combination of a geometric and a non-geometric pattern may be used.

Though the above examples have generally been associated with processing chambers for wafers, such processing chambers may be for a display, such as an LED or other display, screen, a solar panel, or other substrates. Additionally, examples of light source-based detection systems 591 are described below with reference to FIGS. 7-1, 7-2, 10, 11-1, 11-2, and 12.

Figures 1, 7:
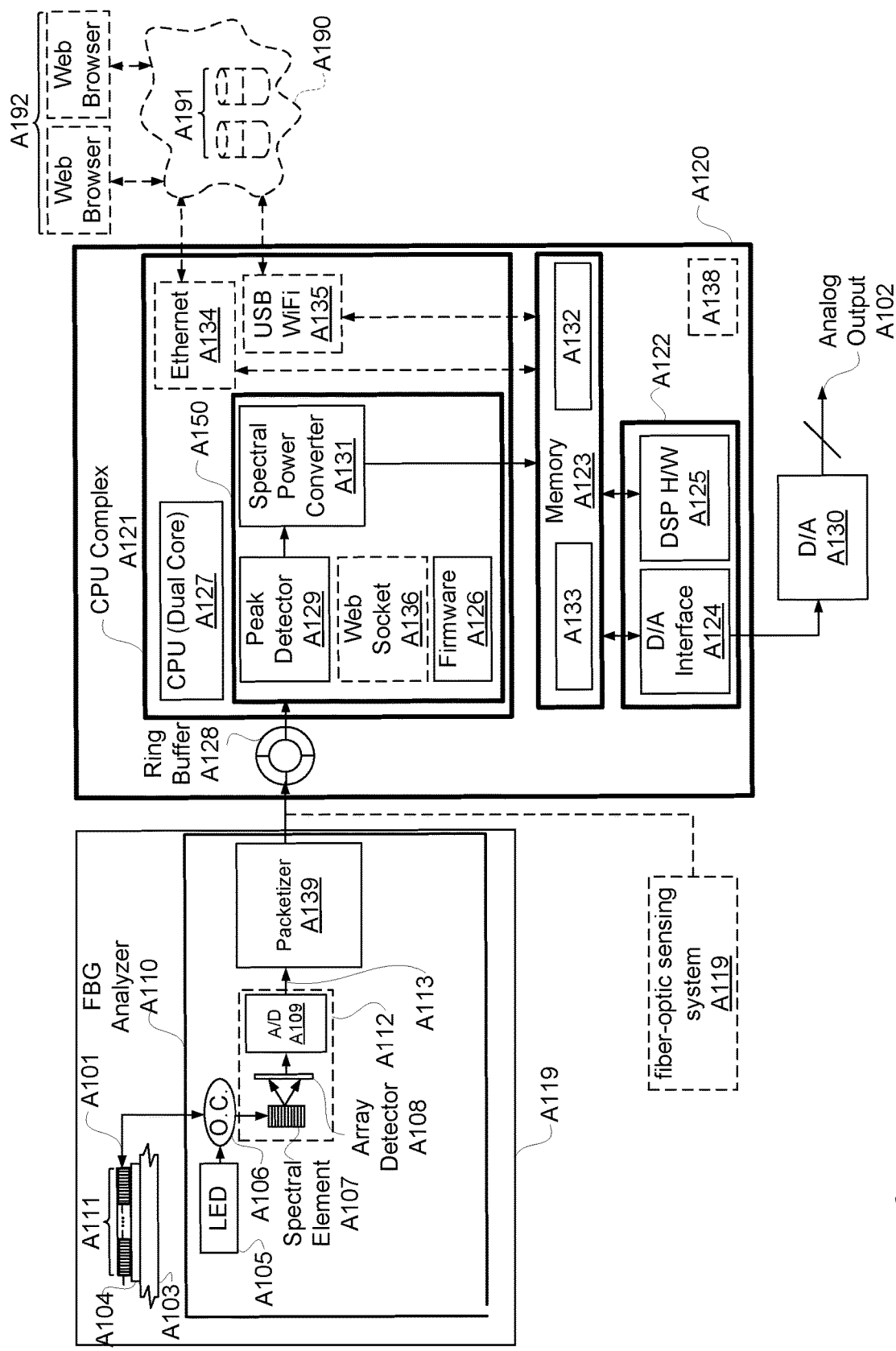
Figures 2, 7:
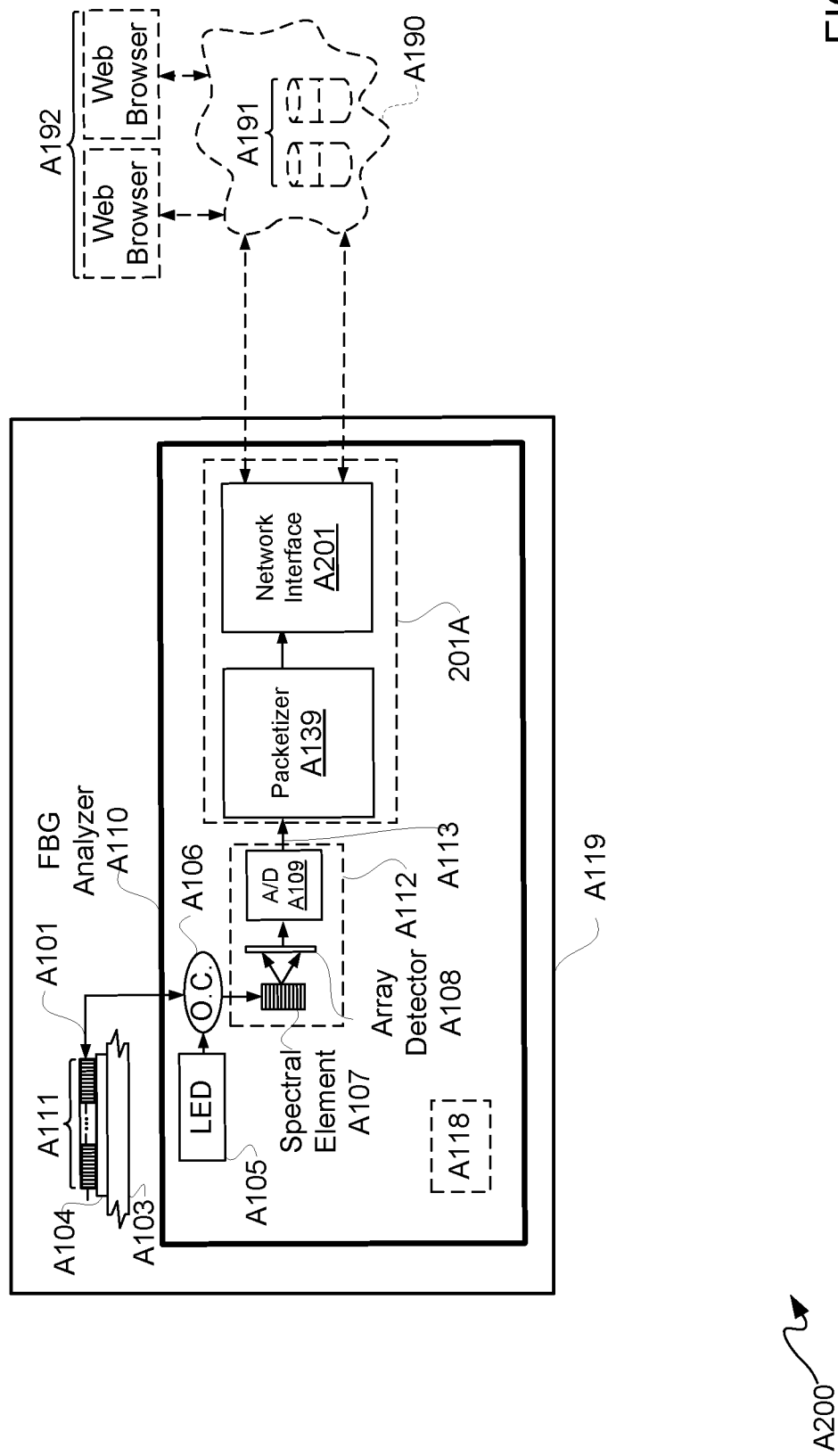

FIG. 7-1 is a block diagram depicting an exemplary fiber-optic strain system A100. Fiber-optic strain ("FOS") system A100 may be configured to convert optical signals from FBG fiber-optic sensors A111 in a rosette or rosette-like pattern into analog voltage outputs that may be directly interfaced with strain instrumentation. FOS system A100 may include a subsystem, namely fiber-optic system for sensing ("fiber-optic sensing system") A119.

Along those lines, an example FBG interrogation system may have broadband super-luminescent light-emitting diodes ("SLED"), an optical circulator, and a spectral engine A112, such as for example an InGaAs spectral engine. A commercially available spectral engine A112 may include a Volume Phase Grating ("VPG") for a spectral element A107 and a multi-element array detector A108, such as for example an InGaAs CCD (charge-coupled device) array detector. In such system, an optical signal reflected back from FBG fiber-optic sensors A111 may be spectrally dispersed with such a VPG, such that reflected power from each VPG may extend over only a few pixels of a CCD array detector. This reflected power extending to just a few pixels may represent a sufficient number of data points for a downstream digital signal processor or digital signal processing algorithms of a general-purpose processor to be applied to provide higher resolutions. Using a multi-element array detector facilitates high-speed parallel processing, real time spectrum inspection with sub-millisecond ("sub-ms") response times, and sub-pico meter ("sub-pm") spectral resolution.

Strain-induced wavelength shifts experienced by one or more of FBG fiber-optic sensors A111 may be converted to analog voltage signals ("analog output") A102 that resemble parametric outputs of a conventional strain gauge signal conditioner. This allows an FOS system A100 to work as a high-performance "drop-in" replacement for a signal conditioner in conventional strain measurement systems, as described below in additional detail. Additionally, analog output A102 may be used to provide temperature measurements.

FOS system A100 may include an FBG Analyzer ("FBGA") module A110, a System-on-Chip ("SoC") module A120, FBG fiber-optic sensors A111 in an optical fiber A101, an optical fiber-to-structure bonding material A104, and a digital-to-analog ("D/A") converter A130. Optionally, FOS system A100 may be coupled to a network A190, which may include the Internet or other network, for Cloud storage/computing A191. Optionally, one or more web-browser enabled devices A192 may be used to communicate with such Cloud storage/computing A191 via such network A190.

FBG fiber-optic sensors A111 in optical fiber A101 housing may be coupled to receive and provide an optical signal via such optical fiber A101, the former of which may be for optical transmission of light from a broadband light source A105. A bonding material A104 may be used to couple optical fiber A101 having FBG fiber-optic sensors A111, namely bonding FBG fiber-optic sensors A111 to a material or structure under test A103. A cyanoacrylate or other adhesive may be used for example for a bonding material A104. Optionally, rather than direct bonding to a material or structure under test A103, a polymer substrate may be used as described below in additional detail.

A broadband light source A105, such as an LED light source, including an SLED, of FBGA module A110 may provide light to an optical circulator A106 of FBGA module A110, and such light may be sent through to optical fiber A101 via passing through optical circulator A106 through to FBG fiber-optic sensors A111. Responsive to strain-induced wavelength shifts experienced by one or more of FBG fiber-optic sensors A111, reflected light from FBG fiber-optic sensors A111 may be provided as returned optical signals via optical fiber A101 to optical circulator A106 for spectral element A107 of FBGA module A110. As described below in additional detail, more than one optical fiber A101 may be coupled to provide a rosette or rosette-like pattern of FBG fiber-optic sensors A111, which may be coupled to a spectral element A107 through optical circulator A106.

Reflected light may be spectrally dispersed through spectral element A107, which in this example is one or more VPGs of a spectral engine A112 of FBGA module A110. Such dispersed light may be detected by a photodiode array A108 of FBGA module A110, which in this example is an InGaAs photodiode array; however, other types of photodiode arrays may be used in other implementations. As described above, a spectral engine A112 may include a CCD array detector A108. Along those lines, a CCD array detector A108 may include or perform the function of an analog-to-digital converter ("A/D") converter A109 as part of spectral engine A112. In another example, a separate A/D converter A109 may be used, as either an analog or digital array detector A108 may be used. For purposes of clarity and not limitation, it shall be assumed that a photodiode array A108 is used that does not incorporate an A/D converter A109.

Data output of photodiode array A108 may be digitized using an A/D converter A109 of FBGA module A110 to provide digital data output A113. Digital data output A113 of A/D converter A109 may be packetized by an on-board integrated circuit packetizer A139 of FBGA module A110, which in this example is separate from an FPGA of SoC module A120. However, in another implementation, packetizer A139 and/or A/D converter A109 may be implemented in an FPGA of SoC module A120. Such packetized information may be forwarded from packetizer A139 to SoC module A120 for post-processing. Packetizer A139 may be for hardwired Ethernet or other hardwired communication, or packetizer A139 may be for wireless communication, such as for WiFi, WLAN, or other wireless traffic. Moreover, even though a single channel system is illustratively depicted, a multi-channel system may be implemented as described below in additional detail.

SoC module A120 may include a CPU complex A121, a programmable gate array device A122, and main memory A123. In this example, such programmable gate array device A122 is an FPGA; however, in other implementations, other types of integrated circuits, whether programmable gate array devices or not, may be used to provide a digital-to-analog ("D/A") interface A124 and digital signal processing ("DSP") hardware A125.

CPU complex A121, which may be on a same FPGA as D/A interface A124 and DSP hardware A125 in another implementation, in this implementation includes a dual-core CPU A127 running firmware A126. However, a single core or other types of multi-core CPUs may be used in other implementations. Generally, a signal conversion block A150, which may be in CPU complex A121, may include a peak detector A129, a Web socket A136, firmware stored in memory ("firmware") A126, and a spectral power converter A131. Firmware A126 may receive data from packetizer A139 of FBGA A110 into a ring buffer A128 of SoC module A120, which may also be of CPU complex A121.

Ring buffer A128 may be used to store a continuous stream of samples from packetizer A139 of FBGA A110 to in effect allow FOS system A100 to plot outputs of FBG fiber-optic sensors A111 in a rosette or rosette-like pattern over a period of time. Firmware A126 may be configured to clean up data from ring buffer A128. Data from ring buffer A128 may be provided to a peak detector A129, and detected peaks may be provided from peak detector A129 to spectral power block A131 to quantify spectral power associated with each of such peaks detected. Along those lines, firmware A126 may quantify wavelength shifts, which are directly proportional to the amount of strain experienced and spectral power sensed by each of FBG fiber-optic sensors A111 in a rosette or rosette-like pattern. This post-processed data A132 may be stored in main memory A123.

In this implementation, programmable gate array A122, which is coupled to main memory A123, is configured to provide hardware that reads data A132 that firmware A126 has placed in main memory A123 and that performs signal processing tasks on such data A132 using DSP hardware A125. An example of a signal processing task may be an FFT and/or the like to measure any vibration components in data A132.

Output of DSP hardware A125, such as an FFT output for example, may be written back to main memory A123 as data A133 for use by CPU complex A121. D/A interface A124 of programmable gate array device A122 may be used to send FBG sensor data A132 to an external D/A converter A130 to mimic a parametric output of a conventional strain signal conditioner. FOS system A100 may work as a high-performance "drop-in" replacement for a signal conditioner in conventional strain measurement systems, and so analog output A102 may be provided to conventional strain measurement instrumentation (not shown). Each output of D/A converter A130 may represent an output of one FBG fiber-optic rosette sensor of FBG fiber-optic sensors A111.

CPU complex A121 via firmware A126 may be configured to read strain data A133 that programmable gate array A122 has placed in main memory A123. CPU complex A121 may optionally include either or both an Ethernet interface A134 or a USB WiFi interface A135 to forward strain data A133 to one or more remote computers connected over network A190. Optionally, an external Cloud server or servers for providing Cloud storage/computing A191 may take outputs from multiple FOS systems A100 and store them in a database for further analysis by software running on such Cloud server(s). In this example, such computers may include multiple HTML5-compliant Web browsers A192 to communicate with such Cloud servers and/or to communicate with one or more FOS systems A100 to access strain data A133, which may allow users to make business decisions and/or configure individual FOS systems A100 using corresponding optional Web sockets A136 of CPU complexes A121 of such systems. However, in another or this implementation data may be wirelessly transferred, using for example a TCP/IP protocol, to a remote or local notebook computer for data analysis.

For portability, SoC module A120 and one or more fiber-optic sensing systems A119 may be powered with a battery-based power supply ("battery") A138, which in this example may be a 5 volt battery power supply. Along those lines, because of an ability to multiplex data from FBG sensors, more than one fiber-optic sensing system A119 may optionally be coupled to a same SoC module A120. Such one or more fiber-optic sensing systems A119 may be coupled to a same ring buffer A128, such as using USB or other type of communication connection. However, for purposes of clarity and not limitation, only one-to-one relationship between fiber-optic sensing system A119 and SoC module A120 is described below.

FIG. 7-2 is a block diagram depicting an exemplary FOS system A200. FOS system A200 is the same as FOS system A100 of FIG. 7-1, except SoC module A120 is replaced with a network interface A201, and functions associated with SoC module A120 may be performed by Cloud storage/computing A191.

Fiber-optic sensing system A119 may optionally be a standalone system, such as without an interrogator node directly mechanically coupled thereto. Along those lines, a smaller battery power supply ("battery") A118 than battery A138 may be used to power fiber-optic sensing system A119.

Network interface A201 may be an Ethernet or other type of network interface configured for hardwired and/or wireless communication with a network A190. In this example, network interface A201 is for wirelessly communicating with network A190 for sending packetized data from packetizer A139 to network A190 for Cloud storage/computing A191. Along those lines, data sourced from FBG fiber-optic sensors A111 may be stored and processed remotely with respect to FBGA module A110. Processing operations, including associated processing functions, provided with SoC module A120 may be provided with Cloud storage/computing A191. Moreover, network interface A201 may be configured to include packetizer A139. Network interface A201 may be incorporated into FBGA module A110 or may be separate therefrom.

To recapitulate, multifunctional integrated FBG fiber-optic sensors A111 may be coupled to an FBGA module A110, as part of an interrogation system. FBG fiber-optic rosettes as described herein can be interrogated by a compact, wireless, battery powered fiber-optic interrogator for both strain and AE detection, such as by SoC module A120. Optionally or additionally, such interrogation system may be remotely provided using Cloud storage/computing A191. A fiber-optic rosette array may be field deployed with a multichannel wireless interrogator node to allow data to be remotely recorded, analyzed, and displayed for visualization and large scale damage prognostics. Along those lines, a fiber-optic rosette array, such as of FBG fiber-optic sensors A111, may be used with Cloud storage/computing A191 for storage and/or analysis of such data obtained.

In the former example implementation, FBG fiber-optic sensors A111 may be used with a miniaturized interrogation device, including a stand-alone compact multichannel fiber-optic strain/AE interrogator with wireless data acquisition capability for strain and damage monitoring. In the latter example implementation, FBG fiber-optic sensors A111 may be used with only an FBGA module A110 of such a miniaturized interrogation device with wired and/or wireless data acquisition capability for strain and damage monitoring.

The latter example implementation facilitates wide spread deployment of FBG fiber-optic sensors A111 coupled to an FBGA module A110. Such FBG fiber-optic sensors A111 and FBGA module A110 systems may be compact and low power. Such FBG fiber-optic sensors A111 and FBGA module A110 systems may be deployed with only battery-based power systems and wireless connectivity. Moreover, use of a broadband light source for collecting a signal for strain measurement may reduce cost, size and power consumption in comparison with a narrowband light source.

Figure 8:
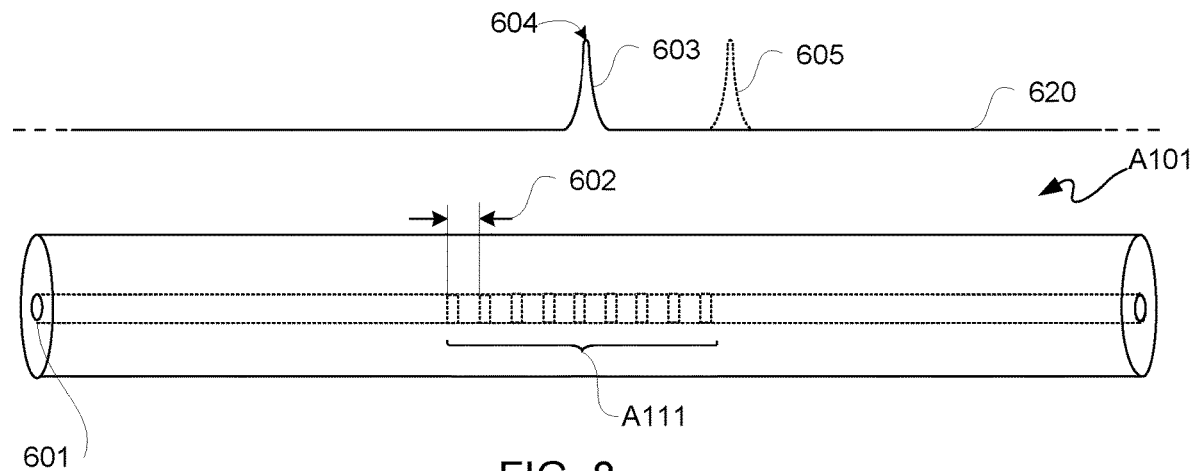
FIG. 8 is a perspective side view depicting an exemplary optical fiber and a corresponding reflected signal.

FIG. 8 is a perspective side view depicting an exemplary optical fiber A101 and a reflected signal 620. Optical fiber A101 may have a fiber core 601. Fiber core 601 may include FBG fiber-optic sensors A111 inscribed on single-mode photosensitive silica-based fibers, such as Ge/B doped silica fibers for example. Input edge-to-input edge spacing 602 between neighboring FBG fiber-optic sensors A111 may be Λ, and refractive indexes η of FBG fiber-optic sensors A111 may be different from one another, such as $\eta_0$ through $\eta_3$ for example, for forming a Bragg grating.

A sensor rosette patch, such as previously described, may be coupled to a miniaturized interrogation device including a stand-alone compact multichannel fiber optic strain interrogator with optional wireless data acquisition. Optionally, such interrogator may be coupled to an energy harvesting device. Such a fiber-optic sensor may be: only a few grams in weight (e.g., 10 grams or less for sensor weight); compact (e.g., 0.2 mm×2 mm×1 cm or smaller); responsive (e.g., a response time of measured in a few milliseconds or less); immune to EM interference; and highly sensitive to strain and stress wave signals from DC to ultrasonic frequency with flat (e.g., no resonance) response. Such a sensor may be passive, so as not to consume power. Such a sensor size may be multiplexed along length of an optical fiber A101. Such a sensor may have an AE resolution of sub-nanostrain and a load resolution of sub-microstrain.

A core refractive index of fiber core 601 may have a digital clock-like pattern corresponding to FBG fiber-optic sensors A111 and spacings 602. Spectral response of an input signal may be different than spectral response of a transmitted signal, and spectral response of a transmitted signal may be different than spectral response of a reflected signal.

With respect to a spectral response of a reflected signal 620 from FBG fiber-optic sensors A111, under an unstrained or baseline condition for optical fiber A101, such reflected spectral response 610 may appear as an impulse 603 centered at a Bragg wavelength 604 or $\lambda_B$. However, under a strained or non-baseline condition for optical fiber A101, such reflected spectral response may appear as an impulse centered at a wavelength other than a Bragg wavelength, such as generally indicated by an example impulse 605 shifted in wavelength away from impulse 603. This wavelength shift may be detected and correlated to strain causing such wavelength shift.

Discrete sensing using FBG fiber-optic sensors A111 as point sensors, with a laser or broadband light source, may be implemented to measure strain, temperature, pressure, vibration, and/or AE. However, distributed sensing using FBG fiber-optic sensors A111 may be implemented using a pulse laser light source and generally an entire sensing length of an optical fiber A101, such as a silica fiber (e.g., a pure silica fiber) as a sensing medium. Such distributed sensing may be used to measure strain, distributed temperature sensed ("DTS"), and/or distributed acoustics sensed ("DAS").

Figures 1, 9:
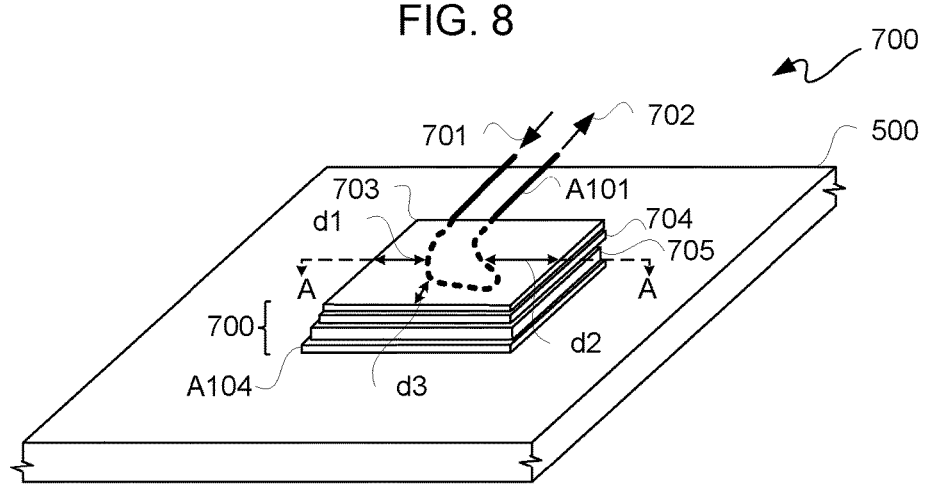
Figures 2, 9:
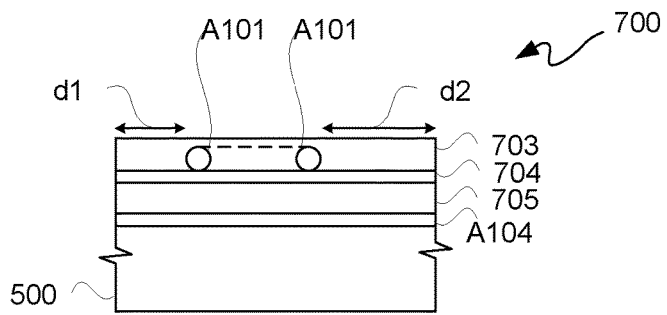

FIG. 9-1 is a block diagram of a perspective view depicting an exemplary patch 700 attached to a host structure, such as a processing chamber 500 for example. FIG. 9-2 is a block diagram of a cross-sectional view along A-A of patch 700 of FIG. 9-1. With simultaneous reference to FIGS. 7-1 through 9-2, patch 700 is further described.

Patch 700 may have a single FBG sensor or more than one FGB sensor. One or more patches 700 may be used to provide a rosette or rosette-like pattern. A rosette or rosette-like pattern may be formed by having one or more optical fibers A101 coupled and/or taped down to a backing 705.

In this example, backing 705 may be formed using one or more flexible thin films with an FBG baseline strain after embedding. Backing 705 thickness, width, and/or length may be adjusted according to an application. For example, a bond ply used in flexible printed circuit industry or other suitable flexible substrates may be use together with epoxies to bond an entire FBG sensor rosette pattern, including the grating and non-grating fiber sections of three optical fibers A101. Thus even though only one optical fiber A101 is illustratively shown for purposes of clarity, it should be understood that more than one optical fiber A101 may be attached to a patch 700. Moreover, an input end 701 of a section of optical fiber A101 may be used for receiving a transmitted optical signal, and an output end 702 of such section of optical fiber A101 may be used for reflecting back a reflected optical signal associated with such transmitted optical signal.

Patch 700 may be bonded directly with a bonding material A104 to a surface of a host structure, such as a processing chamber 500 for example, to be monitored. A bonding material A104 layer may be used to couple backing 705 to host structure.

An encapsulation material suitable for use with FBG sensors may optionally be used for a stronger strain coupling to a host structure to be monitored. Such encapsulation material may be for additional protection from environmental forces and/or structural integrity. In this example, an encapsulation layer 703 is used to encapsulate a section of optical fiber A101, including at least the entirety of an FBG sensor thereof. Optionally, an adhesive film 704 may be used to couple a section of optical fiber A101 to backing 705 prior to encapsulation by encapsulation layer 703.

For example, Dupont Kapton® polyimide film backing from CS Hyde Company coupled with Henkel-Adhesives Hysol® 9696 adhesive film may be implemented optionally with a polyurethane protective film layer for encapsulation. Hysol® film parameters published by the vendor include a thickness of 0.001 in. and a tensile strength of 30 ksi. A polyurethane protective film layer can be thermoformed around a section of optical fiber A101 to provide protection from environmental factors while minimizing any effects on structural coupling of one or more FBG fiber-optic sensors A111 to a host structure, such as a processing chamber 500 for example.

Geometry may be optimized for maximum strain transfer from a host structure to FBG fiber-optic sensors A111. For example, positioning of patch edges with respect to FBG fiber-optic sensors A111 may be used to reduce or minimize edge effects at the location of FBG fiber-optic sensors A111. Accordingly, distances d1, d2, and d3 from outer edges of optical fiber A101 to corresponding outer edges of encapsulation layer 703 or backing layer 705, as applicable, may be adjusted to reduce or minimize edge effects.

Thickness and material properties of a backing and one or more adhesive layers may impact the transfer of strain. Along those lines, backing 705 may be expanded to allow integration of FBG fiber-optic sensors A111 to form a rosette or rosette-like pattern on a single patch. Once a geometric arrangement for FBG fiber-optic sensors A111 of a patch 700 is determined, such as by finite element analysis, at least two FBG fiber-optic sensors A111 may be encapsulated in a rosette or rosette-like pattern.

For example, to precisely control the orientation of FBG fiber-optic sensors A111 to create a rosette pattern, a stencil may be created, such as by laser cutting a thin sheet of plastic in a desired geometry for example. Adhesive may be placed within stenciled areas, and FBG fiber-optic sensors A111 may be set in place in such stenciled areas. Such stencil may be removed while adhesive is curing. A protective encapsulation layer may be applied, and a heat gun may be used to provide sufficient temperature to thermoform such protective encapsulation layer to such patch assembly, including eliminating any air-gaps.

Figure 10:
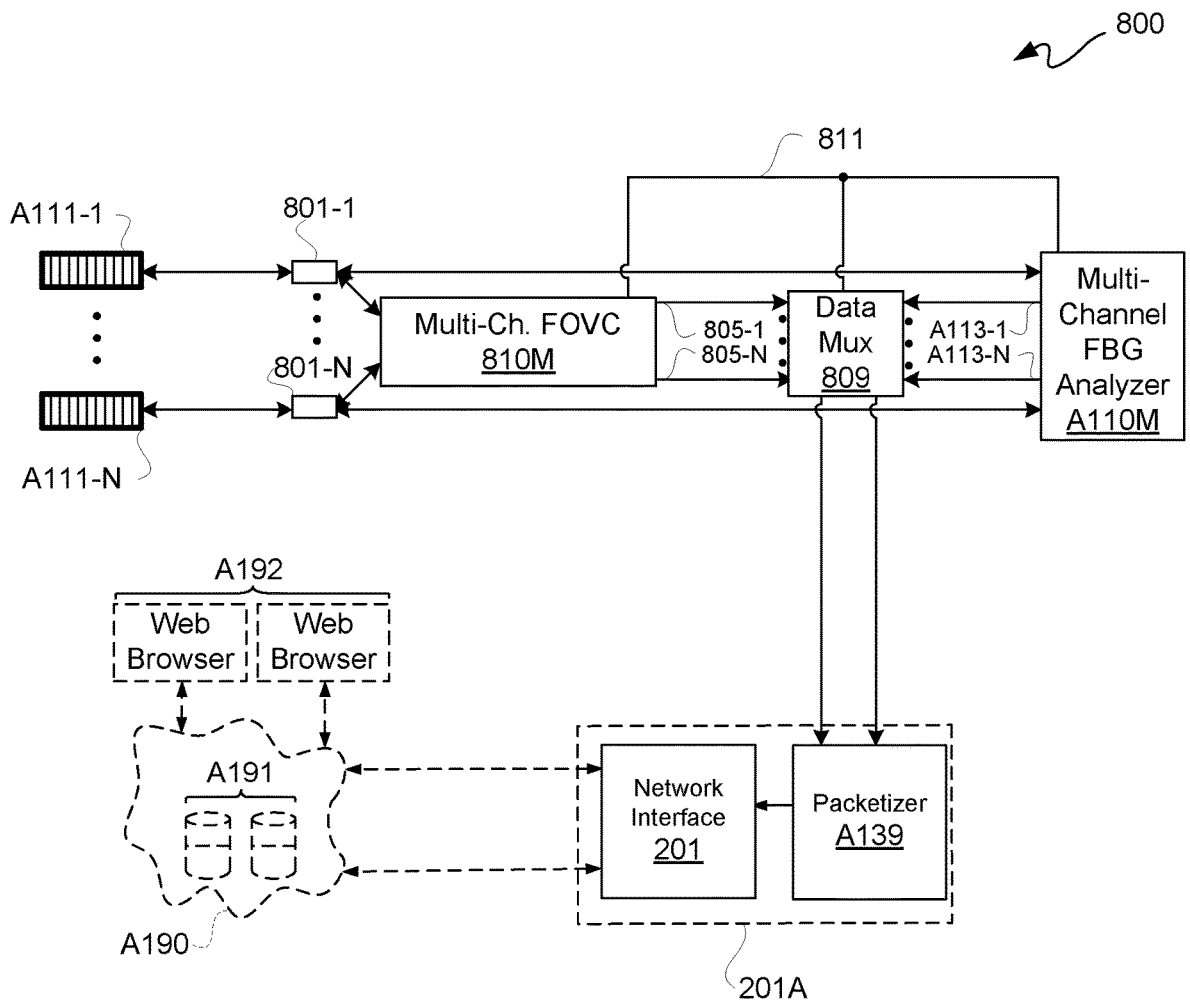
FIG. 10 is a block diagram depicting an exemplary acoustic emission ("AE") and FOS system.

With respect to AE and strain, FIG. 10 is a block diagram depicting an exemplary AE and FOS system 800. In this example, there are N, for N a positive integer greater than one, FBG fiber-optic sensors A111-1 through A111-N coupled through corresponding optical multiplexers or optical circulators 801-1 through 801-N to a multi-channel fiber optic voltage conditioning ("FOVC") 810M and a multi-channel FBG analyzer A110M. Even though a multi-channel FOVC 810M and a multi-channel FBG analyzer A110M are described, a single-channel FOVC 810 and a single-channel FBG analyzer A110 may be used in another implementation as follows from the more complex description of a multi-channel implementation.

Multi-channel FOVC 810M and multi-channel FBG analyzer A110M may be operated out-of-phase with respect to one another in order to share FBG fiber-optic sensors A111-1 through A111-N. For example, multi-channel FOVC 810M and multi-channel FBG analyzer A110M may be operated or active on opposite states of a sync control signal 811 coupled to multi-channel FOVC 810M and multi-channel FBG analyzer A110M.

A detailed description of a multi-channel FOVC may be found in U.S. patent application Ser. No. 14/814,355. However, this or another type of multi-channel FOVC compatible with an FBG sensor may be used.

On a timing interval of control signal 811 for which multi-channel FOVC 810M is to be active, multi-channel FOVC 810M may transmit signals to FBG fiber-optic sensors A111-1 through A111-N to receive corresponding returned signals. Multi-channel FOVC 810M may process such returned signals to provide ADC converted voltage analog outputs as digital data outputs 805-1 through 805-N corresponding to such returned signals. Such digital data outputs 805-1 through 805-N may be provided to a data multiplexer ("mux") 809.

Control signal 811 may optionally be used for providing a control select to mux 809 for selecting either digital data outputs 805-1 through 805-N or digital data outputs A113-1 through A113-N for an interval of a cycle of control signal 811. Along those lines, a 50-50 duty cycle or other duty cycle commensurate with timing of operations of multi-channel FPVC 810M and multi-channel FBG analyzer A110M may be used.

On a timing interval of control signal 811 for which multi-channel FBG analyzer A110M is to be active, multi-channel FBG analyzer A110M may transmit signals to FBG fiber-optic sensors A111-1 through A111-N to receive corresponding returned signals. Multi-channel FBG analyzer A110M may process such returned signals to provide ADC converted voltage analog outputs as digital data outputs A113-1 through A113-N corresponding to such returned signals. Such digital data outputs A113-1 through A113-N may be provided to a mux 809.

A selected output of mux 809 may be provided to a packetizer A139, which may be time-slice shared by multi-channel FPVC 810M and multi-channel FBG analyzer A110M for wireless transmission of data, such as previously described and not repeated here for purposes of clarity and not limitation.

Figures 1, 11:
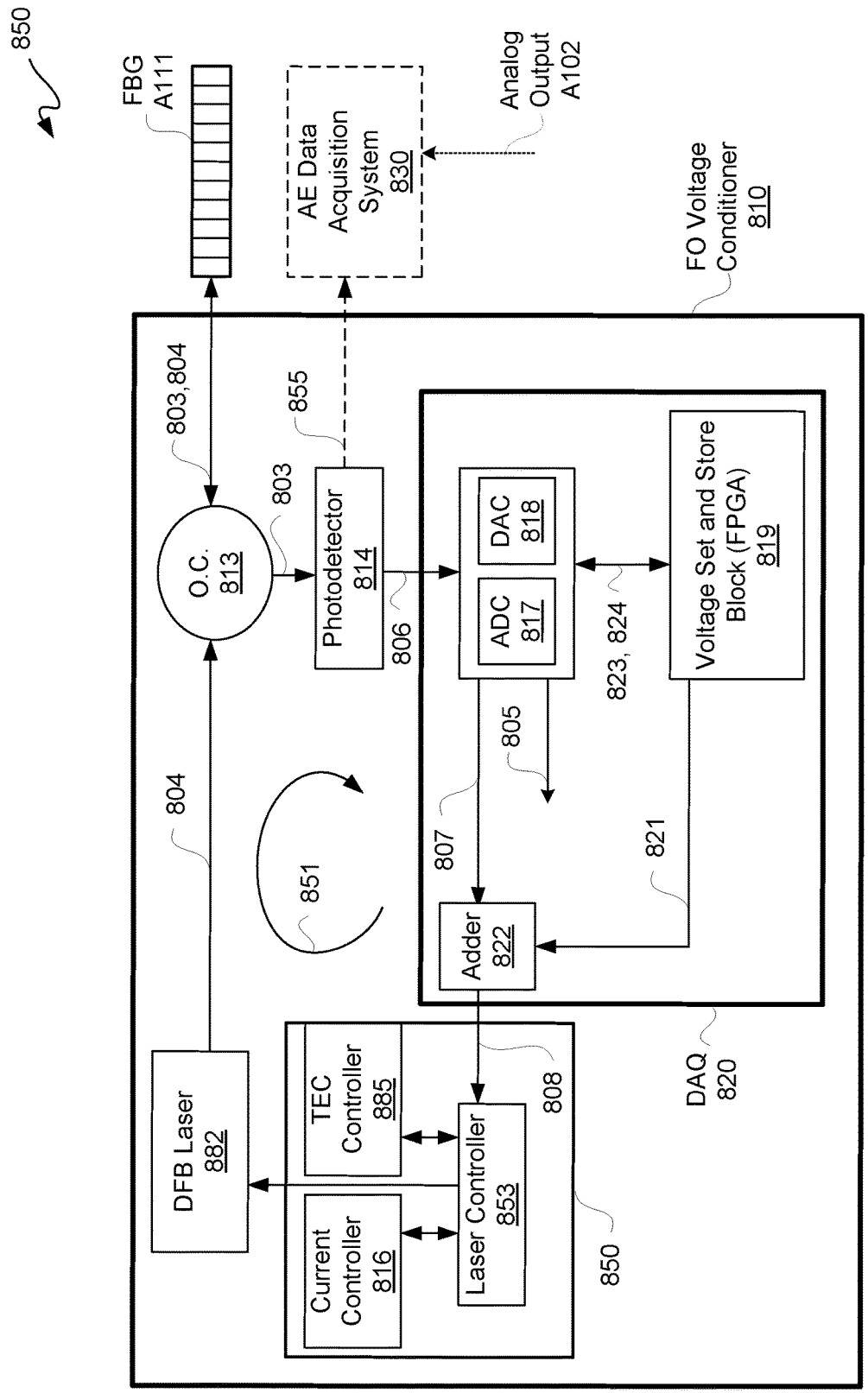
Figures 2, 11:
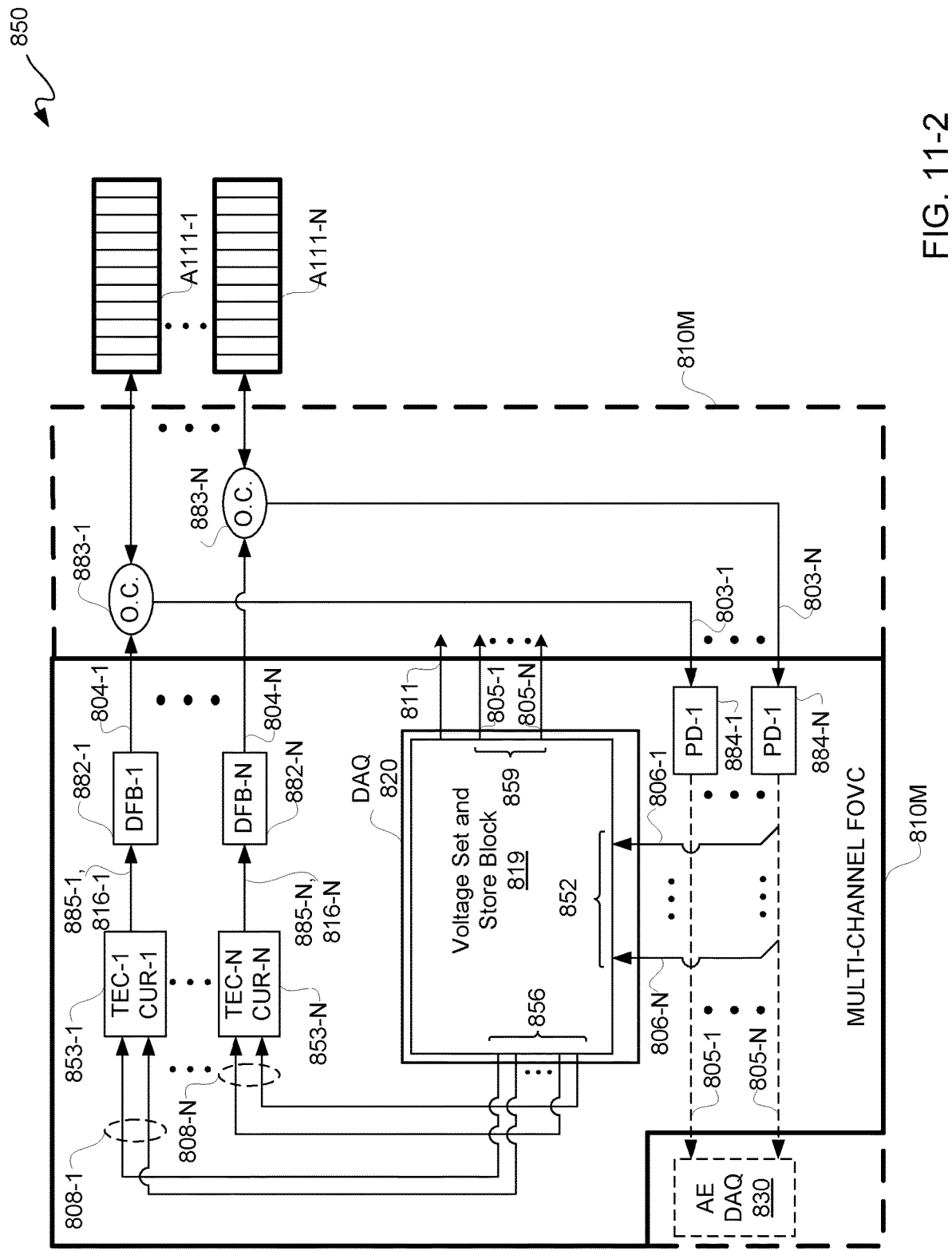

FIG. 11-1 is a block diagram depicting an exemplary single-channel laser tracking-based fiber optic voltage conditioning system 850. In order to provide voltage conditioning for acoustic emissions ("AEs") measurements, an open/closed loop control 851 of FOVC 810 of fiber optic voltage conditioning system 850 may be used to actively track a laser to Bragg wavelength of an FBG fiber-optic sensor A111.

A function of laser tracking-based FOVC 810 may be to provide fiber optic voltage conditioning of returned optical signal 803 coupled to FBG sensors (collectively and singly "FBG sensor") A111 via a fiber optic cable or line, as described below in additional detail. Along those lines, a multifunction fiber optic sensor, such as fiber Bragg grating sensor, may be used. For AE measurements, using a fiber Bragg grating sensor in a fiber optic housing, an entire sensing area can be bonded directly to a surface of a structure ("measurement surface") such as with a permanent epoxy or other bonding material. The direct bonding of a bare fiber to a measurement surface may provide a high-level of stress wave coupling from such measurement surface to a sensing area.

However, over time such bonding material may result in local stress along such Bragg grating sensor, such as along a grating length for example, and this may lead to creation of an unstable optical cavity formed by multiple gratings, such as along such grating length for example. These optical cavities may negatively affect FOAE sensor performance by changing the slope of a Bragg reflection spectrum and/or increasing Fabry-Perot noise. To address this issue, an overhanging ridge configuration may be used, where a grating under tension may be used for hanging over two stand-offs bonded to a structure's surface to address the above-described problem, such as for AE and/or strain sensing. Moreover, for an overhanging ridge configuration, a grating may be used for hanging over shear wave-coupling gel, on either or both sides thereof, to provide a flexible bonding to a structure's surface to address the above-described problem, such as for AE and/or temperature sensing. Optionally, a package sensor multiplexing two or more FBG sensors on the same package with different Bragg wavelengths installed can be multiplexed in serial or parallel. Such a package sensor may be used for AE, strain, and/or temperature sensing. Moreover, optionally a multiplexed-multi-sensing package sensor may be used. For example, two or more different types of sensors (e.g., AE/strain and AE/temperature) can be multiplexed on the same package for multi-sensing.

Optionally, another function of such laser tracking-based FOVC 810 may be to convert returned optical signal 803 from FBG sensor A111 to an optional AC voltage analog output 855 that may directly interface with conventional AE instrumentation, which is illustratively depicted as optional AE data acquisition system 830. An optional analog signal output 855 of FOVC 810 may resemble that of a piezoelectric sensor used in conventional AE measurements, facilitating sensor "drop in replacement". Optionally, analog output signal A102, as previously described herein, may be provided to AE data acquisition system 830 in order to trigger operation thereof.

Along those lines, conventional piezo-electric sensors/preamplifier signal conditioners can be completely replaced with a combination of FBG sensor A111 and FOVC 810 as described herein without changing existing AE software and electronics of conventional AE data acquisition systems, such as AE data acquisition system 830 for example, leading to significant cost saving through minimizing additional hardware/software installation. In other words, a high-frequency, high-gain photodetector output 805 carrying a high frequency signal may be interfaced directly to an analog input of a conventional AE data acquisition system 830, such as a Mistras PCI-2 DAQ board from Mistras Group, Inc. of Princeton Junction, New Jersey, for example.

Light 804, which may be from a compact, commercially available distributed feedback ("DFB") laser or other laser 882, may be passed via an optical circulator 813 to an FBG sensor A111. A returned optical signal 803 from FBG sensor A111 passing through optical circulator 813 may be routed to a photodetector 814. Current control 816, which may be separate from or part of DFB laser 882, may be initially set at a midrange value between a lasing threshold and a maximum current limit, and a thermoelectric cooler ("TEC") control 885, which may be separate from or part of DFB laser 882, may be tuned to move laser wavelength to a mid-reflection point ("V REF") of a Bragg wavelength of FBG sensor A111.

With laser current and TEC control voltages settled at initial set points, namely V TEC SET and V CUR SET 821, laser wavelength may be locked to a mid-reflection point of FBG sensor A111 using simultaneous TEC and current tracking through a closed loop 851 proportional-integral-derivative ("PID") feedback control.

For adjustment for real-time laser tracking control, a chip-based data acquisition ("DAQ") board 820, such as an FPGA-based or other System-on-Chip-based ("SoC-based") circuit board, may be used to record at least one of a low-gain and/or low-frequency of photodetector output signal 806, namely as associated with an analog input to analog-to-digital converter ("ADC") 817 and to generate a PID control signal 807 of DAC 818.

By "low-gain" and "low-frequency", it is generally meant an analog output signal being below both a threshold gain and a threshold frequency, respectively, where such thresholds represent an external environmental change and/or perturbation, including without limitation a change in one or more of temperature, strain, pressure, and/or stress of a structure under test, including a structure being monitored, as sensed by one or more FGB sensors coupled to one or more optical fibers. Accordingly, such thresholds may vary from application-to-application depending upon the type of structure being tested, as well as use of such structure.

An analog output signal 806 of photodetector 814 may be converted to a digital data output signal 805 by ADC 817, and a digital output of ADC 817 may additionally feed an input of a voltage set and store block 819. A digital output of voltage set and store block 819 may feed an input of DAC 818 to provide an analog PID control signal 807. PID control signal 807 may include a PID current error ("CUR ERR") signal and a PID TEC error ("ERR") signal. PID control signal 807 may be output from DAC 818.

For purposes of clarity by way of example and not limitation, it shall be assumed that an FPGA is used to set and store voltages; however, in another implementation another type of SoC may be used, including without limitation an ASSP, ASIC, or other IC. Along those lines, voltage set and store block ("FPGA") 819 may be used to set and store a laser current voltage and a TEC control voltage, namely V TEC SET and V CUR SET 821, and FPGA 819 may be used to store a mid-reflection point V REF of a Bragg wavelength of FBG sensor A111. FPGA 819 may be coupled to receive a digital output 823 from ADC 817, where such digital output 823 is a conversion of an analog photodetector output signal 806. FPGA 819 may be configured to generate and store TEC and laser current error voltages, namely a V TEC ERR and a V CUR ERR, using such digital output 823 received. FPGA 819 may provide a digital PID control signal 824, where such digital PID control signal includes a V CUR ERR signal and a V TEC ERR signal, to DAC 818, and DAC 818 may convert such digital PID control signal 824, namely a V TEC ERR signal and a V CUR ERR signal, to analog PID control signal 807 having analog PID CUR ERR and PID TEC ERR signals.

PID CUR and TEC error signals from PID control 807 may be correspondingly added to CUR and TEC set voltages 821 by adder 822, and respective sums 808 output from adder 822 may be fed into a controller 850 for adjustment of control information provided to laser 882. In this example, for purposes of clarity and not limitation controller 850 is broken out into three controllers or modules, namely a laser controller 853 coupled to a current controller 816 and a TEC controller 885. However, in another implementation, current controller 816 and/or TEC controller 885 may be part of a laser, such as DFB laser 882 for example. Sums 808 may be used together to compensate for drift of a Bragg wavelength, such as due to external environmental changes and/or perturbation including without limitation changes in one or more of temperature, strain, pressure, and/or stress, by actively tuning laser wavelength responsive to such current and TEC control. Even though a DFB laser 882 is used, in another implementation a broadband light source or other type of light source may be used.

In this example, both laser TEC and current are used simultaneously to compensate for FBG wavelength drift from DC up to approximately 20 kHz for photodetector output signal 806. TEC tracking may be provided by changing temperature of DFB laser 882 via TEC control 885 to compensate for FBG sensor A111 wavelength drift caused by environmental changes. While providing large dynamic range, such as for example approximately several thousand microstrains for strain monitoring, TEC compensation may be slow, with a maximum response time in the order of seconds or longer.

In this example, fast, such as for example a few Hz to 20 kHz or higher, real time compensation may not be possible with TEC tracking. Along those lines, laser current compensation, as described herein, may be used with a much higher response time, possibly up to approximately 20 kHz or higher, subject to limitations of response time of electronics of laser controller 853, and such laser current compensation may be used simultaneously with TEC tracking. Tracking by changing laser injection current may cause changes in both laser wavelengths and intensity, although with much more limited dynamic range, such as for example approximately several hundred microstrains for dynamic strain tracking. For larger dynamic strain monitoring, such as more than approximately a thousand microstrains, commercially available distributed Bragg reflector ("DBR") lasers can be used in place of DFB lasers. However, it should be appreciated that using TEC and current tracking in combination provides extended dynamic range and fast response for laser tracking.

Long-distance AE measurement using a laser-based FBG interrogation may be subject to presence of high amounts of optical noise associated with the Fabry-Perot effect generated by an optical cavity created by two or more reflective mirrors. By "interrogation," it is generally meant providing a light signal to an optical sensor coupled to a material or structure under test and obtaining a light signal in return from such optical sensor to obtain information therefrom regarding such material or structure under test. A Bragg grating itself may be considered a highly reflective mirror. In the presence of another reflective surface from an optical component, such as for example an optical circulator or a scattering center such as a local defect present in a long optical fiber, unstable, unwanted constructive optical interferences can be generated due to laser coherence. Accordingly such interferences may contribute to increased AE background noise, and as a consequence can significantly reduce a signal-to-noise ratio ("SNR") in AE measurements.

To suppress this optical noise, a combination of circulators and optical isolators between reflection and/or scattering surfaces may be used to provide unidirectional optical paths and avoid bidirectional optical paths between any two reflective optical components, such as described below in additional detail.

FIG. 11-2 is a block diagram depicting an exemplary multichannel FOVC system 850. Multichannel FOVC system 850 is further described with simultaneous reference to FIGS. 11-1 and 11-2.

In multichannel FOVC system 850, an N-channel FOVC 810M is respectively coupled to FBG sensors A111-1 through A111-N via corresponding optical circulators 883-1 through 883-N, for N a positive integer greater than one. FBG sensors A111-1 through A111-N may be respective discrete FOAE sensors or an array thereof.

DFB1 through DFBN lasers 882-1 through 882-N and corresponding photodetectors ("PD") PD1 884-1 through PDN 884-N may be respectively coupled to optical circulators 883-1 through 883-N. Each of DFB lasers 882-1 through 882-N may deliver corresponding laser lights 804-1 through 804-N respectively into FBG sensors A111-1 through A111-N via corresponding circulators 883-1 through 883-N. Circulators 883-1 through 883-N may then be used to pass corresponding returned optical signals 803-1 through 803-N respectively from sensors A111-1 through A111-N on a per channel basis. Returned optical signals 803-1 through 803-N may be respectively provided onto photodetectors 884-1 through 884-N.

Each of the outputs of photodetectors 884-1 through 884-N, which may be implemented in an example implementation as photodiodes ("PD") PD1 through PDN, may be split into two sections, namely analog signals 806-1 through 806-N and optionally analog signals 805-1 through 805-N. One group, namely a low frequency signal output group of signals 806-1 through 806-N, may be input into an analog input interface 852, such as respective analog input ports for example, of an FPGA-based data acquisition system 820 for laser tracking control generation as previously described herein. Another optional group, namely a high frequency signal output group of analog signals 805-1 through 805-N, may optionally be input to a conventional multichannel AE DAQ system 830 for AE measurement.

Even though an FPGA 819 is used as described herein for DAQ 820, another type of SoC, an ASSP, an ASIC, or other VLSI type of integrated circuit device may be used instead of FPGA 819. However, for purposes of clarity and not limitation, it shall be assumed that an FPGA 819 is used. Furthermore, DAC 820 may exist in a single integrated circuit device, whether such device is a monolithic integrated circuit or an integrated circuit formed of two or more integrated circuit dies packaged together.

An FPGA 819 may have sufficient resources for integration of one or more ADCs 817, one or more DACs 818, and/or one or more adders 822 therein for providing a multichannel FOVC 810M. However, an FPGA may lack sufficient analog resources, and so a separate analog chip, such as for providing digital-to-analog conversions, may be used. However, for purposes of clarity by way of example and not limitation, it shall be assumed that FPGA 819 has a sufficient number of ADCs 817 for converting analog signals 806-1 through 806-N into corresponding digital data outputs 805-1 through 805-N. FPGA 819 may include a digital interface 859 for outputting digital data outputs 805-1 through 805-N. Optionally, FPGA 819 may be configured with a control signal generator circuit to generate and output a control signal 811.

In this example, FOVC 810M includes a DAQ 820 having an FPGA 819 configured for inputs 1 through N of an analog input interface 852 ("inputs 852") and outputs 1 through 2N of an analog output interface 856 ("outputs 856"), for example separate analog output ports. Inputs 852 may correspond to a group of signals 806-1 through 806-N. Pairs 808-1 through 808-N of outputs may respectively be provided to laser controllers 853-1 through 853-N. Laser controllers 853-1 through 853-N may provide respective pairs of TEC and current control signals 885-1, 816-1 through 885-N, 816-N to DFBs 882-1 through 882-N, respectively.

For purposes of clarity by way of example and not limitation, laser controllers 853-1 through 853-N are illustratively depicted as including corresponding pairs of current and TEC controllers, which were illustratively depicted as separate controllers 816 and 885, respectively, in FIG. 11-1 for purposes of clarity. However, it should be understood that controllers 885 and 816 may be incorporated into a laser controller 853.

For purposes of scaling an FOVC 810, it should be appreciated that a single FPGA 819 may be used by a DAQ 820 configured to support N channels. In this example, FOVC 810M does not include optical circulators 883-1 through 883-N; however, in another configuration, FOVC 810M may include optical circulators 883-1 through 883-N.

Generally, FPGA 819 generates respective sets, such as pairs for example, of TEC and current control signals 808-1 through 808-N via analog output ports 856 of DAQ 820, and such respective sets of TEC and current control signals 808-1 through 808-N may be used to provide corresponding pairs of TEC control and current control signals 885-1, 816-1 through 885-N, 816-N to respectively lock DFB lasers 882-1 through 882-N to their respective FBG sensors A111-1 through A111-N by adding respective error signals. Such respective error signals may be generated from FPGA 819 generated PID control to provide current and TEC set points via digital summing as previously described herein, though on a per-channel basis in this example of FOVC 810M. For long distance measurements, N fiber extenders, whether all transmission fiber extenders, all reflection fiber extenders, or a combination thereof may be used in conjunction with multichannel FOVC 810M.

Figure 12:
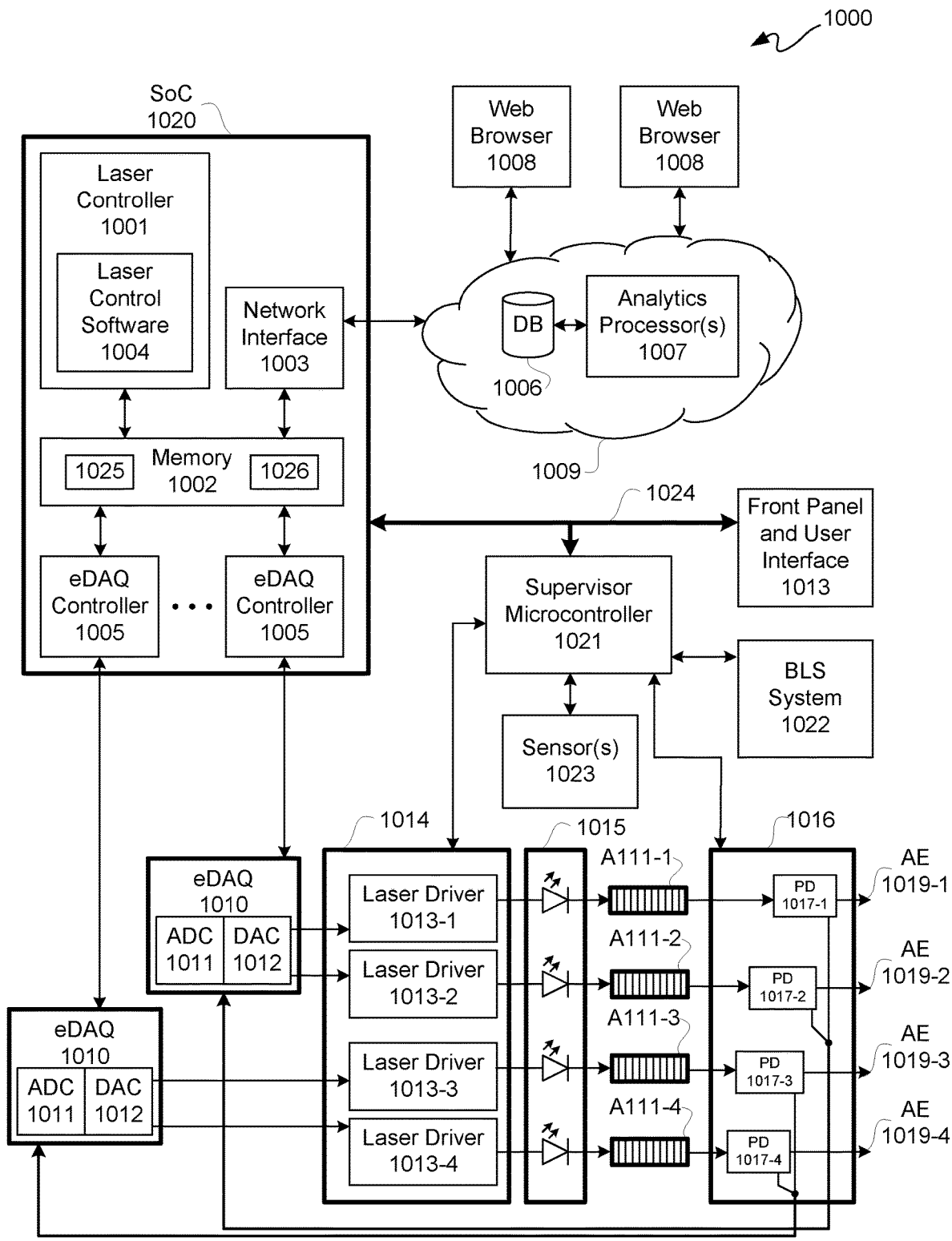
FIG. 12 is a block diagram depicting an exemplary wavelength tracking system using fiber optic voltage conditioning for sensing AE.

FIG. 12 is a block diagram depicting an exemplary wavelength tracking system 1000 using fiber optic voltage conditioning, as described above, for sensing AE. Wavelength tracking system 1000 uses a broadband light source system ("BLS system") 1022, such as previously described for measuring microstrain. BLS system 1022 provides a monitoring subsystem for wavelength tracking system 1000 to provide an initial FBG position for FOAE tracking recovery. Along those lines, BLS system 1022 may have multiple wavelengths within a BLS. For example, each color in broadband light from a broadband light source represents a different wavelength. Wavelength multiplexing may be used to feed information to a controller 1021. Controller 1021 may be implemented to include a finite state machine ("FSM"). In an example implementation, controller 1021 may be implemented with a microcontroller. For purposes of clarity by way of example and not limitation, controller 1021 shall be assumed to be a microcontroller 1021. Microcontroller 1021 may be a trusted "supervisor microcontroller", and microcontroller 1021 may be used to prompt BLS system 1022 to feed information for a particular wavelength for tracking recovery.

One or more lasers may be used with BLS system 1022 for dynamic configuration or reconfiguration. In order to provide voltage conditioning for acoustic emissions ("AE") measurements, an open/closed loop control system may be used to actively track a wavelength of a narrowband tunable light source, such as a distributed feedback ("DFB") laser, to a Bragg wavelength of a fiber Bragg grating ("FBG") sensor. A wavelength tracking-based fiber optic acoustic emission voltage conditioner ("FOVC") may be used to convert an optical signal from FBG sensors to an AC voltage output that can directly interface with conventional AE instrumentation. The signal output of such an FOVC resembles that of a piezo-electric sensor used in convention AE measurements, facilitating sensor "drop in replacement".

However, AE with laser tracking is sensitive, and thus more likely to lose tracking. To quickly recover tracking or moving to another wavelength, a laser may be tuned to lock to a different FBG wavelength of one of FBG sensors A111. For example, if there is a "hot spot" indicated by microstrain measurements obtained from BLS system 1022, one or more lasers may be directed to such "hot spot" using dynamic reconfiguration by dynamically retuning such one or more lasers to lock to one or more corresponding different FBG wavelengths. For example, when a rosette principal direction drifts from a nominal value indicating presence of damage, one or more lasers may be tuned to one or more FBG wavelengths associated with such rosette. Independently or in addition to retuning for microstrain detected damage, one or more lasers of an AE data acquisition system may be locked to one or more FBG wavelengths for a "wake up" mode and/or when a load exceeds a load threshold.

Different wavelengths may be in a rosette including different FBG wavelengths. Moreover, a BLS light may share a fiber with a laser source light, where a BLS and a laser use same or different wavelengths, as a laser source can overwhelm a BLS source. Furthermore, with different FBG wavelengths, lasers may share a same fiber.

Wavelength tracking system 1000 includes a SoC 1020, which optionally may be used for edge computing. SoC 1020, may be an FPGA with one or more FPGA-based microprocessors, which may be coupled to a cloud-based computing system 1009 through a network interface 1003 of such SoC 1020. Such a cloud-based computing system 1009 may include data storage 1006, such as may include database ("DB") software, and one or more processors 1007 configured with analytics software, such as SaaS for example, for processing raw and feature extracted data obtained from SoC 1020. Optionally, such SoC 1020 may be configured for local processing of raw data, such as for extraction of information from such raw data, in an optional FPGA-based edge computing configuration. Along those lines, SoC 1020 may send results and/or information obtained from local processing of raw data, rather than, or optionally in addition to, sending raw data in order to conserve bandwidth and/or enhance overall processing capacity. One or more web browser computers or other web-configured devices 1008 may be put in communication with cloud-based computing system 1009 for accessing stored data, whether raw and/or processed data.

SoC 1020, in addition to network interface 1003, may include a laser controller 1001, memory 1002, and one or more electronic data acquisition ("eDAQ") controllers, such as eDAQ controllers 1005 for example. Laser controller 1001 may be configured with laser control software 1004.

Laser controller 1001 and network interface 1003 may be coupled through and share memory 1002. Additionally, eDAQ controllers 1005 may be coupled to and share memory 1002. While two eDAQ controllers 1005 are illustratively depicted, in another example fewer or more than two eDAQ controllers 1005 may be used.

A supervisor microcontroller 1021 may be coupled through bus 1024 to SoC 1020 for communication therewith. However, in another implementation, supervisor microcontroller 1021 may be incorporated into SoC 1020. Memory 1002 may be configured with a look-up table 1025. Look-up table 1025 may include predetermined settings for different FBG wavelengths for one or more eDAQ controllers 1005, eDAQ converters 1010, laser drivers 1013, photodetectors 1017, and/or other components of wavelength tracking system 1000. Such settings in lookup table 1025 may be used for tuning one or more modules of wavelength tracking system 1000 for optimum performance for a variety of applications.

To provide supervised wavelength tracking, a multichannel sensor interrogation array may be used. Different and/or same types of logistics sensors 1023, such as a GPS sensor, an accelerometer sensor, and/or a liquid monitoring sensor, among other types of sensors, may be used for logistics for an AE sensing application. Additionally or optionally, logistics sensors 1023 may include one or more controllers for pulse generators. Such one or more controllers for pulse generators may be configured to generate predefined periodic pulses of stress waves for individual automated sensor testing ("AST"). These stress waves may be used to provide acousto-ultrasonic testing to capture a principal strain and a principal direction of each sensor rosette using pitch catch and/or pulse-echo processing. Along those lines, for example a piezo-electric actuator may be placed remotely from or proximate to supervisor microcontroller 1021, and a controller for pulse generation may be in wireless communication with such an actuator for causing such actuator to pulse for propagation of such pulse along a monitored structure. Such a controller for pulse generation and/or other logistics sensors 1023 may be coupled to supervisor microcontroller 1021 for obtaining different sensing inputs associated with logistics, multi-sensing data collection and/or sensor fusion analytics, which may include one or more of finite state machine states including wake-up call triggering, system initialization, wavelength tuning, tracking control, wavelength monitoring, tracking recovery, system shutdown, and dynamic re-configuration for on-demand new sensor selection.

A BLS system 1022 may be coupled to supervisor microcontroller 1021 for providing wavelength tracking. A front panel and user interface 1013 may be coupled through bus 1024 to SoC 1020 and supervisor microcontroller 1021 for unlocking those components, if locked. Along those lines, SoC 1020 and supervisor microcontroller 1021 may be protected with boot protection, which may be hardware and/or software based protection. Additionally, front panel and user interface 1013 may be coupled through bus 1024 to SoC 1020 and supervisor microcontroller 1021 for initializing and monitoring status of those components.

In a trusted mode of operation, a trusted supervisor microcontroller 1021 may be responsible for unlocking and initializing hardware sub-modules. With a trusted boot of supervisor microcontroller 1021, SoC 1020, an array of laser drivers 1014, and an array of photodetectors ("PDs") 1016 may be unlocked and initialized under control of supervisor microcontroller 1021. A locked state may be present at power-up or reset of wavelength tracking system 1000. A look-up table 1026 in memory 1002, or in memory of microcontroller 1021 in another implementation, may be preloaded with specific information to prohibit functioning of wavelength tracking system 1000 responsive to a failure of authentication of one or more module components of such system. In other words, authentication may be performed at initialization to validate a system configuration of wavelength tracking system 1000.

Additionally, supervisor microcontroller 1021 may be configured to monitor system statistics of wavelength tracking system 1000 to ensure proper operation, such as operation within predefined parameters for example. If a module or other portion of wavelength tracking system 1000 is not operating within predefined parameters, supervisor microcontroller 1021 may halt or shut down such module or other portion not operating within predefined parameters.

Supervisor microcontroller 1021 may additionally provide "black box" functionality by allowing an external device to view logged events, which may be periodically logged by supervisor microcontroller 1021. Such an event log may be used to view a state of wavelength tracking system 1000, including an ability to determine for example whether an anomalous event has occurred. Supervisor microcontroller 1021 may communicate with front panel and user interface 1013 to illuminate status LEDs or other devices used to communicate status to allow a user to have up-to-date information about operation of wavelength tracking system 1000.

Supervisor microcontroller 1021 may be used to offload system management tasks from SoC 1020 from real-time control processes running on SoC 1020, which in this example is implemented with an FPGA. These real-time control processes may be used for controlling eDAQ converters 1010.

Crack growth and/or damage hot spot monitoring using an FBG rosette may be used to distinguish between damage and its effect on principal strain direction and/or changes in loading by comparing with neighboring rosettes. Principal strain direction at one or more FBG rosettes may shift in the presence of a local crack for example, while one or more nearest neighbor FBG rosettes may not indicate any change. Thus, one or more FBG rosettes touching or proximate to such local damage may be used to indicate damage.

Along those lines, in an example for a local crack or other detectable damage, the principal direction of a rosette touching or proximate to a crack may show change independent of temperature, geometry or any other background change. In addition to being independent of environmental conditions, a nearest neighbor damage index may be baseline free, which may be useful in applications with more or less arbitrary loading conditions. In other words, no pristine or other background information need be used, such as measured and subtracted out, because local information may be directly compared to global information. In other words, one or more rosettes local to a damage site may be directly compared to one or more nearest neighbors absent a baseline. Such a direct comparison may be used to avoid false positives, as comparison with nearest neighbor rosettes may be used to indicated damage without being confounded by load direction and/or load magnitude. Any change in load direction may change principal strain vectors at all rosettes in an array; however, with nearest neighbor comparisons, local damage may only change the principal strain vector at such local location.

For a nearest neighbor comparison, damage severity may be quantified by using a normalized damage index ("DI") formula as follows:

$$DI = \sin\left|\theta_i - \frac{1}{n}\sum_{k=1}^{n}\theta_k\right|$$

where i is a rosette immediately at or adjacent to a damage instance, such as a crack for example, and k are one or more nearest neighbor rosettes. The larger the difference between i and k may indicate a larger amount of damage.

For a grid or array of rosettes, both near field and far field effects of loading may be detected. A damage index value for DI may range from 0 to 1, inclusive, with 0 being no crack and with 1 being for a rosette directly on a crack. Along those lines, a DI value may be compared or otherwise processed against other DI values of other rosettes in a grid to identify a damage region, or at least a probability of a damage region relative to such DI value. However, as indicated above, a baseline-free DI value is an absolute value for an FBG, and not a relative value as compared to some existing DI-based damage detection techniques that requires knowledge of the pristine condition as a baseline reference for background subtraction. This means that a baseline-free DI value obtained from a local discontinuity in a principal direction compared to one or more of its nearest neighbors may generally be insensitive to changes in a local environment, boundary conditions, loading conditions, and may be used to indicate a "permanent" shift in a principal direction due to damage.

Moreover, rosettes may be used to provide damage imaging for real-time visualization and/or post damage evaluation. Rosettes may be placed on interior and/or exterior surfaces of a structure to form a two-dimensional and/or three-dimensional image. Rosettes may be provided in a single layer or multiple layers.

eDAQ controllers 1005 may respectively control eDAQ converters 1010. While two eDAQ converters are illustratively depicted, in another implementation more or fewer eDAQ converts 1010 may be used. Each eDAQ converter 1010 may include an ADC 1011 and a DAC 1012.

eDAQ converters 1010 may be used for providing analog signals to laser drivers 1013. In this example, there are laser drivers 1013-1 and 1013-2 fed by one eDAQ converter 1010, and there are laser drivers 1013-3 and 1013-4 fed by another eDAQ converter 1010. Laser drivers 1013 may be set to different FBG wavelengths. So in this example, four different wavelengths for laser light outputs may be used with analog information from two eDAQ converters 1010.

Outputs from laser drivers 1013 may be provided to respective optical LEDs of an array of LEDs 1015. Outputs from LEDs 1015 may respectively be input to FBG fiber-optic sensors A111-1 through A111-4, with each FBG fiber-optic sensor A111 in a rosette or rosette-like pattern. Outputs for FBG fiber-optic sensors A111-1 through A111-4 may be respectively input to photodiodes 1017-1 through 1017-4 of an array of photodiodes 1016. Output of each of photodiodes 1017-1 through 1017-4 is corresponding AE information 1019-1 through 1019-4. AE information 1019-1 and 1019-2 may be fed back to a corresponding source eDAQ converter 1010, and AE information 1019-3 and 1019-4 may be fed back to another corresponding source eDAQ converter 1010.

Because BLS may be more easily tracked than laser light and may consume less power, BLS system 1022 may be used as an initial interrogator of FBG fiber-optic sensors A111, which may be shared with lasers 1013 (though not shown in this FIG. 12 for purposes of clarity and not limitation). If such interrogation results in detection of damage by microstrain information and/or one or more DIs for corresponding FBG fiber-optic sensors A111, lasers 1013 may be used to obtain more precise AE information 1019. SoC 1020 may be coupled to receive an output signal from BLS system 1022 and configured to clean up such output signal, detect peaks in such output signal, and quantify power associated with one or more peaks detected in such output signal. This information from such an output signal may be used by SoC 1020, as SoC may be configured to quantify wavelength shifts in such output signal as being directly proportional to amounts of strain and spectral power sensed by fiber-optic sensors in a rosette or rosette-like pattern. These wavelength shifts may be used to provide one or more wavelength adjustment information for one or more wavelength adjustments to shift one or more laser drivers to corresponding FBG wavelengths of FBG sensors 111 associated with such output indicating a damage area. Such FBG sensors 111, and thus fiber-optic lines associated therewith, may be shared as between lasers and a BLS, as previously described.

In another implementation, such output signal from BLS system 1022 may be combined with information output from one or more logistics sensors 1023, such as by supervisor microcontroller 1021, for providing to SoC 1020, and optionally subsequently to cloud-based computing system 1009, for analysis by either or both SoC 1020 or analytics processors 1007. Analysis results from cloud-based processing at cloud-based computing system 1009 may be communicated to SoC 1020. Such analysis results from either or both SoC 1020 or analytics processors 1007 may be used to identify which one or more FBG sensors 111 to target to obtain AE information 1019 and to shift one or more wavelengths for one or more laser drivers 1013, as previously described, associated with such identified FBG sensors 111. Again, for example, this shift may be for obtaining AE information 1019 for an identified hot spot.

Figure 13:
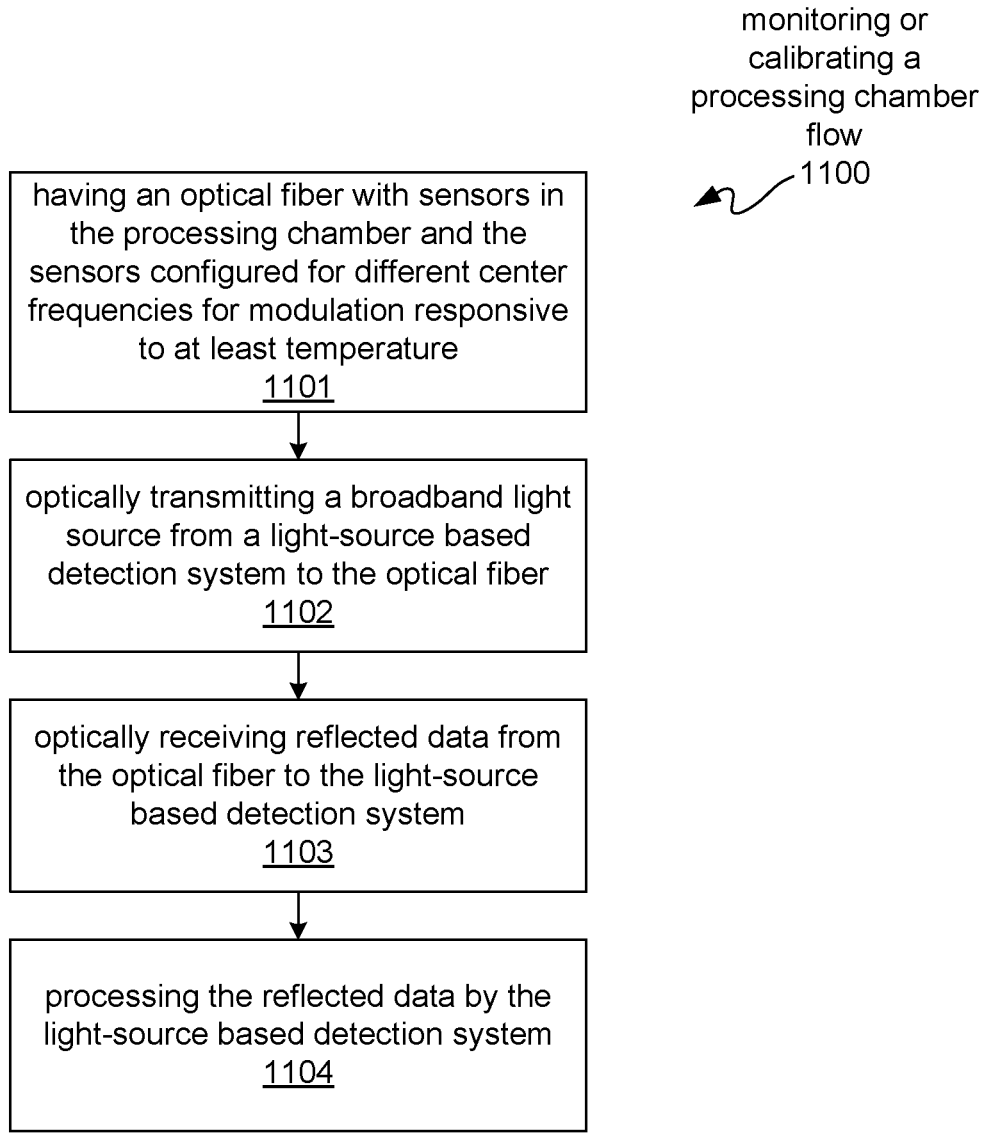
FIG. 13 is a flow diagram depicting an exemplary monitoring or calibrating a processing chamber flow.

FIG. 13 is a flow diagram depicting an exemplary monitoring or calibrating a processing chamber flow 1100. At operation 1101, an optical fiber 205 with sensors, such as FBG sensors 212, is located in a processing chamber 500. FBG sensors 212 may be configured for different center frequencies for modulation responsive to at least temperature, as previously described.

At operation 1102, a broadband light source from a light-source based detection system 591 may be optically transmitted to optical fiber 205. An example of a broadband light source may have a spectrum as previously described herein from 1500 to 1600 nanometers.

At operation 1103, reflected light may be optically received from optical fiber 205 to a light-source based detection system 591. At 1104, such reflected light may be processed by light-source based detection system 591 to generate data at least related to temperature. Such processing may include detection of a shift or other modulation in a Bragg frequency of an FBG sensor, or Bragg frequencies of corresponding FBG sensors.

While the foregoing describes exemplary apparatus(es) and/or method(s), other and further examples in accordance with the one or more aspects described herein may be devised without departing from the scope hereof, which is determined by the claims that follow and equivalents thereof. Claims listing steps do not imply any order of the steps. Trademarks are the property of their respective owners.

What is claimed is:

1. An apparatus for a processing chamber, comprising:
   a thermal controller;
   a light source-based detection system coupled to the thermal controller for communication therewith;
   a heater power source coupled to the thermal controller for communication therewith;
   at least one optical fiber with Fiber Bragg Grating sensors coupled to the light source-based detection system and to at least one gas line located external to the processing chamber;
   at least a portion of the Fiber Bragg Grating sensors of the at least one optical fiber configured to provide temperature-related information associated with the at least one gas line to the light source-based detection system; and
   the light source-based detection system configured to convert the temperature-related information into temperature data.

2. The apparatus according to claim 1, further comprising a controller system coupled for receiving the temperature data.

3. The apparatus according to claim 2, wherein the controller system in communication with the thermal controller is configured to regulate thermal conditions responsive to the thermal data.

4. The apparatus according to claim 2, further comprising a fluid source coupled to the thermal controller, wherein the controller system is configured to monitor flow rate of the fluid source.

5. The apparatus according to claim 1, wherein the at least one optical fiber with the Fiber Bragg Grating sensors is further coupled to at least one peripheral process control component selected from a heater, a flow meter, or an RF generator to provide the temperature-related information associated with the at least one peripheral process control component selected.

* * * * *